(12) United States Patent
Park et al.

(10) Patent No.: US 8,860,087 B2
(45) Date of Patent: *Oct. 14, 2014

(54) NITRIDE SEMICONDUCTOR DEVICE AND MANUFACTURING METHOD THEREOF

(75) Inventors: Young Hwan Park, Seoul (KR); Woo Chul Jeon, Gyeonggi-do (KR); Ki Yeol Park, Gyeonggi-do (KR); Seok Yoon Hong, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 201 days.

This patent is subject to a terminal disclaimer.

(21) Appl. No.: 13/442,494

(22) Filed: Apr. 9, 2012

(65) Prior Publication Data

US 2013/0082277 A1    Apr. 4, 2013

(30) Foreign Application Priority Data

Sep. 30, 2011  (KR) .................. 10-2011-0099794

(51) Int. Cl.
```
H01L 29/66     (2006.01)
H01L 29/778    (2006.01)
H01L 29/417    (2006.01)
H01L 29/423    (2006.01)
H01L 29/20     (2006.01)
```

(52) U.S. Cl.
CPC ....... H01L 29/41725 (2013.01); H01L 29/2003 (2013.01); H01L 29/7787 (2013.01); H01L 29/66462 (2013.01); H01L 29/42316 (2013.01)
USPC .... 257/192; 257/256; 257/282; 257/E21.403; 257/E21.407; 257/E29.246; 257/E29.252; 438/167; 438/172; 438/191

(58) Field of Classification Search
USPC .................. 257/192, 195, 256, 282, E21.403, 257/E21.407, E29.246, E29.252; 438/167, 438/172, 191
See application file for complete search history.

(56) References Cited

U.S. PATENT DOCUMENTS

2006/0138454 A1* 6/2006 Saito et al. .................... 257/192
2007/0249119 A1* 10/2007 Saito ............................. 438/253

FOREIGN PATENT DOCUMENTS

JP    2010-225765     10/2010
KR    10-2004-0013136  2/2004

* cited by examiner

*Primary Examiner* — Su Kim
(74) *Attorney, Agent, or Firm* — McDermott, Will and Emery LLP

(57) ABSTRACT

The present invention relates to a nitride semiconductor device and a manufacturing method thereof. According to one aspect of the present invention, a nitride semiconductor device including: a nitride semiconductor layer having a 2DEG channel; a source electrode in ohmic contact with the nitride semiconductor layer; a drain electrode in ohmic contact with the nitride semiconductor layer; a plurality of p-type nitride semiconductor segments formed on the nitride semiconductor layer and each formed lengthways from a first sidewall thereof, which is spaced apart from the source electrode, to a drain side; and a gate electrode formed to be close to the source electrode and in contact with the nitride semiconductor layer between the plurality of p-type semiconductor segments and portions of the p-type semiconductor segments extending in the direction of a source-side sidewall of the gate electrode aligned with the first sidewalls of the p-type nitride semiconductor segments is provided.

23 Claims, 8 Drawing Sheets

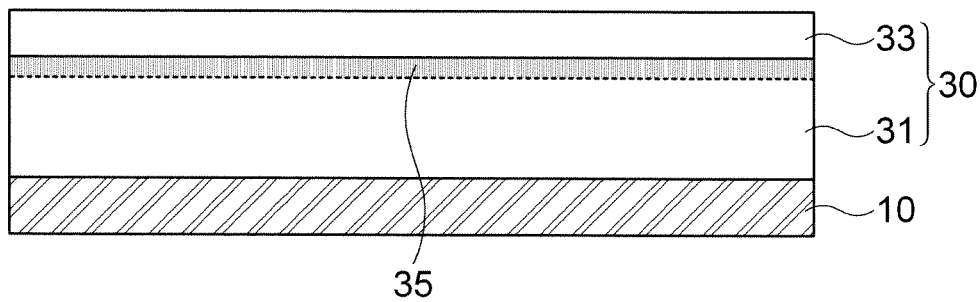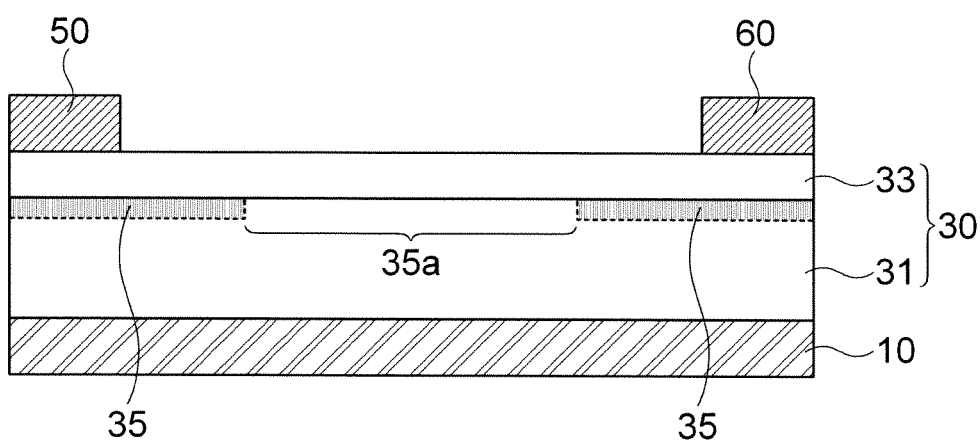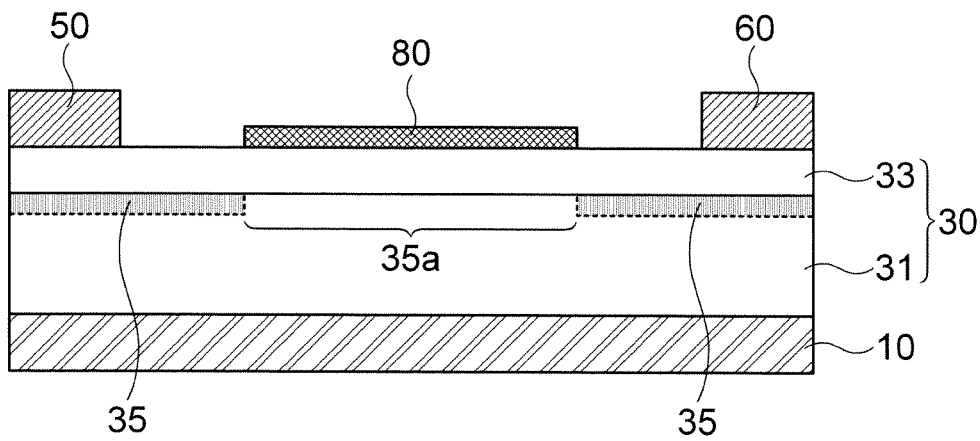

NITRIDE SEMICONDUCTOR DEVICE AND MANUFACTURING METHOD THEREOF

CROSS-REFERENCE TO RELATED APPLICATIONS

Claim and incorporate by reference domestic priority application and foreign priority application as follows:

Cross Reference to Related Application

This application claims the benefit under 35 U.S.C. Section 119 of Korean Patent Application Serial No. 10-2011-0099794, entitled filed Sep. 30, 2011, which is hereby incorporated by reference in its entirety into this application.

BACKGROUND OF THE INVENTION

1. Field of the Invention

The present invention relates to a nitride semiconductor device and a manufacturing method thereof, and more particularly, to a nitride semiconductor device in which a p-type nitride semiconductor layer is partially formed on a nitride semiconductor layer structure, and a manufacturing method thereof.

2. Description of the Related Art

There has been growing interest in reduction of power consumption due to green energy policy. To achieve this, improvement in power conversion efficiency is necessary. In the power conversion, efficiency of a power switching device has influence on the entire power conversion efficiency.

At present, most of power devices generally used are power MOSFETs or IGBTs using silicon. However, an increase in efficiency of the devices is limited due to material limitations of silicon. To overcome this, there have been patent applications which are to increase the conversion efficiency by manufacturing a transistor using a nitride semiconductor such as gallium nitride (GaN).

However, until now, since it is very difficult to manufacture a homogeneous GaN substrate and mostly, a GaN layer is formed on a silicon (Si), sapphire, or silicon carbide (SiC) substrate by heterogeneous growth, there is a difficulty in obtaining a high quality GaN substrate.

Accordingly, until now, since electrical characteristics can't follow theoretical values, studies for improving a withstand voltage in terms of design are in progress.

SUMMARY OF THE INVENTION

A conventional nitride semiconductor, for example, a GaN HFET has difficulty in implementing a high withstand voltage since channel resistance is very low even in turn-off and thus a voltage is concentrated at an end of a gate electrode.

The present invention has been invented in order to overcome the above-described problems and it is, therefore, an object of the present invention to provide a semiconductor device capable of improving a withstand voltage by partially forming a p-type nitride semiconductor layer on a nitride semiconductor layer structure to deplete 2DEG of a channel in turn-off, and a manufacturing method thereof.

In accordance with a first embodiment of the present invention to achieve the object, there is provided a nitride semiconductor device including: a nitride semiconductor layer formed by a heterojunction of a first nitride layer and a second nitride layer, which includes a material with a wider energy band gap than a material of the first nitride layer, and having a two-dimensional electron gas (2DEG) channel formed near a junction interface; a source electrode in ohmic contact with the nitride semiconductor layer; a drain electrode in ohmic contact with the nitride semiconductor layer while being spaced apart from the source electrode; a plurality of p-type nitride semiconductor segments formed on the nitride semiconductor layer between the source and drain electrodes and each formed lengthways from a first sidewall thereof, which is spaced apart from the source electrode by a predetermined distance, to a drain side; and a gate electrode formed between the source and drain electrodes to be close to the source electrode and in contact with the nitride semiconductor layer between the plurality of p-type semiconductor segments and portions of the p-type semiconductor segments extending in the direction of a source-side sidewall of the gate electrode aligned with the first sidewalls of the p-type nitride semiconductor segments.

In another example of the present invention, the first sidewalls of the p-type nitride semiconductor segments may be aligned to coincide with the source-side sidewall of the gate electrode or not to reach the source-side sidewall.

Further, in an example, drain-side second sidewalls of the p-type nitride semiconductor segments may be spaced apart from the drain electrode by a predetermined distance or in contact with the drain electrode.

Further, in accordance with an example, the material of the first nitride layer may be GaN, and the material of the second nitride layer may be AlGaN.

Further, in accordance with an example of the present invention, the p-type nitride semiconductor segments may be made of a p-type semiconductor material obtained by doping the material of the first nitride layer as p-type.

Further, in accordance with a second embodiment of the present invention to achieve the object, there is provided a nitride semiconductor device including: a nitride semiconductor layer formed by a heterojunction of a first nitride layer and a second nitride layer, which includes a material with a wider energy band gap than a material of the first nitride layer, and having a two-dimensional electron gas (2DEG) channel formed near a junction interface; a source electrode in ohmic contact with the nitride semiconductor layer; a drain electrode in ohmic contact with the nitride semiconductor layer while being spaced apart from the source electrode; a plurality of p-type nitride semiconductor segments formed on the nitride semiconductor layer between the source and drain electrodes and each formed lengthways from a first sidewall thereof, which is spaced apart from the source electrode by a predetermined distance, to a drain side; and a gate electrode formed on the nitride semiconductor layer between the source and drain electrodes to be close to the source electrode and having a drain-side sidewall in contact with the first sidewalls of the p-type nitride semiconductor segments.

In another example of the present invention, drain-side second sidewalls of the p-type nitride semiconductor segments may be spaced apart from the drain electrode by a predetermined distance or in contact with the drain electrode.

Further, in an example, the material of the first nitride layer may be GaN, and the material of the second nitride layer may be AlGaN.

Moreover, in accordance with another example, the p-type nitride semiconductor segments may be made of a p-type semiconductor material obtained by doping the material of the first nitride layer as p-type.

Next, in accordance with a third embodiment of the present invention to achieve the object, there is provided a nitride semiconductor device including: a nitride semiconductor layer formed by a heterojunction of a first nitride layer and a second nitride layer, which includes a material with a wider energy band gap than a material of the first nitride layer, and having a two-dimensional electron gas (2DEG) channel formed near a junction interface; a source electrode in ohmic contact with the nitride semiconductor layer; a drain electrode in ohmic contact with the nitride semiconductor layer while being spaced apart from the source electrode; a p-type nitride semiconductor structure formed on the nitride semiconductor layer between the source and drain electrodes and including a trunk portion spaced apart from the source electrode in parallel by a predetermined distance and a plurality of branch segments formed lengthways from the trunk portion to a drain side; and a gate electrode formed between the source and drain electrodes to be close to the source electrode and in contact with the nitride semiconductor layer and the trunk portion of the p-type nitride semiconductor structure, which does not reach a source-side sidewall of the gate electrode aligned with a source-side first sidewall of the trunk portion.

In another example of the present invention, drain-side second sidewalls of the branch segments of the p-type nitride semiconductor structure may be spaced apart from the drain electrode by a predetermined distance or in contact with the drain electrode.

Further, in an example, the material of the first nitride layer may be GaN, and the material of the second nitride layer may be AlGaN.

Moreover, in accordance with another example, the p-type nitride semiconductor structure may be made of a p-type semiconductor material obtained by doping the material of the first nitride layer as p-type.

Next, in accordance with a fourth embodiment of the present invention to achieve the object, there is provided a method of manufacturing a nitride semiconductor device including the steps of: forming a heterojunction nitride semiconductor layer having a two-dimensional electron gas (2DEG) channel near a junction interface by a heterojunction of a first nitride layer and a second nitride layer which includes a material with a wider energy band gap than a material of the first nitride layer; forming source and drain electrodes and a plurality of p-type nitride semiconductor segments by forming the source electrode and the drain electrode, which is spaced apart from the source electrode, to be in ohmic contact with the nitride semiconductor layer and forming the plurality of p-type nitride semiconductor segments on the nitride semiconductor layer, wherein each of the p-type nitride semiconductor segments is disposed between the source and drain electrodes and each formed lengthways from a first sidewall thereof, which is spaced apart from the source electrode by a predetermined distance, to a drain side; and forming a gate electrode which is disposed between the source and drain electrodes to be close to the source electrode and in contact with the nitride semiconductor layer between the plurality of p-type nitride semiconductor segments and portions of the p-type nitride semiconductor segments extending in the direction of a source-side sidewall of the gate electrode aligned with the first sidewalls of the p-type nitride semiconductor segments.

In accordance with another example of the present invention, in the step of forming the gate electrode, the gate electrode may be formed so that the source-side sidewall of the gate electrode is aligned to coincide with the first sidewalls of the p-type nitride semiconductor segments or the first sidewalls of the p-type nitride semiconductor segments are aligned not to reach the source-side sidewall of the gate electrode.

Further, in accordance with another example, the p-type nitride semiconductor segment may be disposed so that drain-side second sidewalls of the p-type nitride semiconductor segments are spaced apart from the drain electrode by a predetermined distance or in contact with the drain electrode.

Moreover, in accordance with another example, the material of the first nitride layer may be GaN, the material of the second nitride layer may be AlGaN, and the p-type nitride semiconductor segments may be formed using p-GaN.

Next, in accordance with a fifth embodiment of the present invention to achieve the object, there is provided a method of manufacturing a nitride semiconductor device including the steps of: forming a heterojunction nitride semiconductor layer having a two-dimensional electron gas (2DEG) channel near a junction interface by a heterojunction of a first nitride layer and a second nitride layer which includes a material with a wider energy band gap than a material of the first nitride layer; forming source and drain electrodes and a plurality of p-type nitride semiconductor segments by forming the source electrode and the drain electrode, which is spaced apart from the source electrode, to be in ohmic contact with the nitride semiconductor layer and forming the plurality of p-type nitride semiconductor segments on the nitride semiconductor layer, wherein each of the p-type nitride semiconductor segments is disposed between the source and drain electrodes and each formed lengthways from a first sidewall thereof, which is spaced apart from the source electrode by a predetermined distance, to a drain side; and forming a gate electrode which is disposed on the nitride semiconductor layer between the source and drain electrodes to be close to the source electrode and of which a drain-side sidewall is in contact with the first sidewalls of the p-type nitride semiconductor segments.

Further, in accordance with an example, the p-type nitride semiconductor segment may be disposed so that drain-side second sidewalls of the p-type nitride semiconductor segments are spaced apart from the drain electrode by a predetermined distance or in contact with the drain electrode.

Moreover, in accordance with another example, the material of the first nitride layer may be GaN, the material of the second nitride layer may be AlGaN, and the p-type nitride semiconductor segments may be formed using p-GaN.

Next, in accordance with a sixth embodiment of the present invention to achieve the object, there is provided a method of manufacturing a nitride semiconductor device including the steps of: forming a heterojunction nitride semiconductor layer having a two-dimensional electron gas (2DEG) channel near a junction interface by a heterojunction of a first nitride layer and a second nitride layer which includes a material with a wider energy band gap than a material of the first nitride layer; forming source and drain electrodes and a p-type nitride semiconductor structure by forming the source electrode and the drain electrode, which is spaced apart from the source electrode, to be in ohmic contact with the nitride semiconductor layer and forming the p-type nitride semiconductor structure, which includes a trunk portion and a plurality of branch segments formed from the trunk portion, on the nitride semiconductor layer, wherein the p-type nitride semiconductor structure is disposed between the source and drain electrodes, the trunk portion is spaced apart from the source electrode in parallel by a predetermined distance, and each of the branch segments is formed lengthways to a drain side; and forming a gate electrode which is disposed between the source and drain electrodes to be close to the source electrode and in contact with the nitride semiconductor layer and the trunk portion of the p-type nitride semiconductor structure which does not reach a source-side sidewall of the gate electrode aligned with a source-side first sidewall of the trunk portion.

Further, in accordance with an example, drain-side second sidewalls of the branch segments of the p-type nitride semiconductor structure may be spaced apart from the drain electrode by a predetermined distance or in contact with the drain electrode.

Moreover, in accordance with another example, the material of the first nitride layer may be GaN, the material of the second nitride layer may be AlGaN, and the p-type nitride semiconductor structure may be formed using p-GaN.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 2 is a schematic cross-sectional view showing the cross section taken along line I-I' in FIG. 1a;

FIGS. 3a to 3d are views schematically showing a method of manufacturing the nitride semiconductor device in accordance with FIG. 1a;

DETAILED DESCRIPTION OF THE PREFERABLE EMBODIMENTS

Figure 1A:
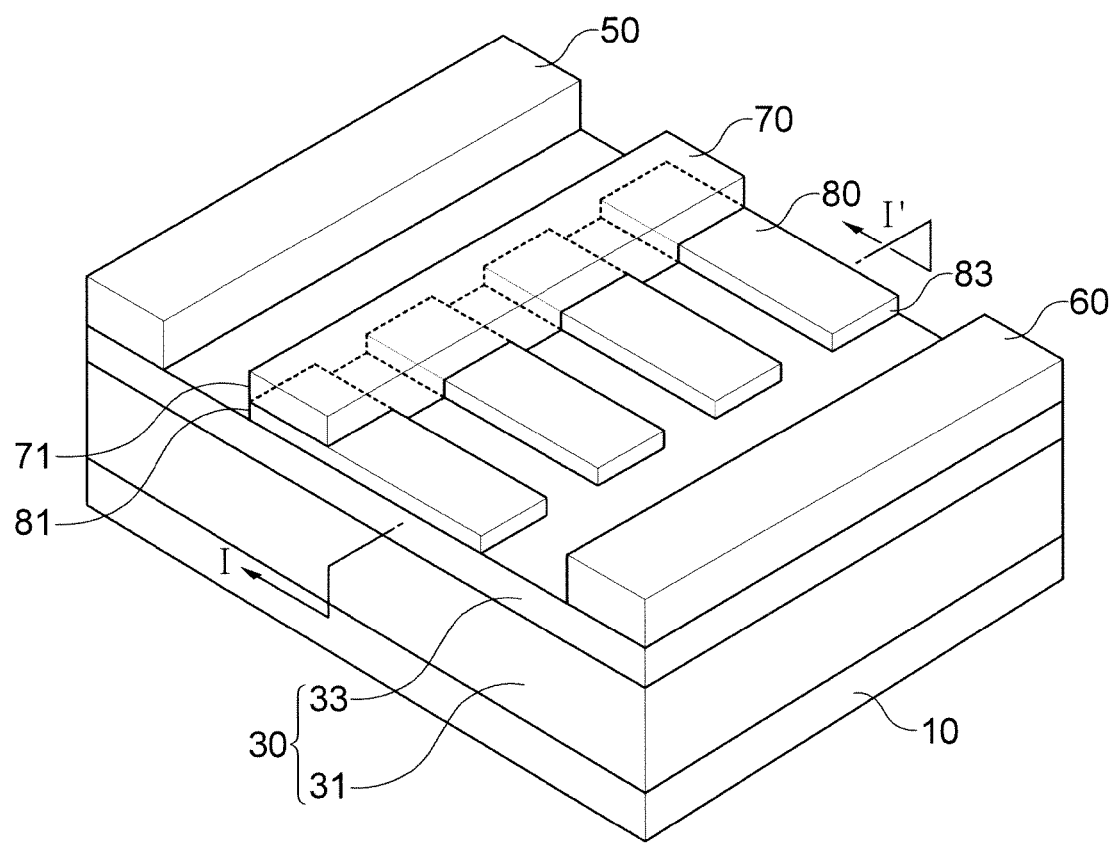
FIGS. 1a and 1b are schematic views of a nitride semiconductor device in accordance with an embodiment of the present invention.

Embodiments of the present invention to achieve the above objects will be described with reference to the accompanying drawings. In the following description, the same elements are represented by the same reference numerals, and additional description which is repeated or limits interpretation of the meaning of the invention may be omitted.

In this specification, when an element is referred to as being "connected or coupled to" or "disposed in" another element, it can be "directly" connected or coupled to or "directly" disposed in the other element or connected or coupled to or disposed in the other element with another element interposed therebetween, unless it is referred to as being "directly coupled or connected to" or "directly disposed in" the other element. Further, in this specification, it should be understood that when an element is referred to as being "on", "over", "above", "under", or "below" another element, it can be "directly in contact with" the other element or in contact with the other element with another element interposed therebetween, unless it is referred to as being directly in contact with the other element. In addition, the relative terms such as "on", "over", "above", "under", or "below" can be used to describe the relation of one element to the other element. At this time, when the direction of the reference element is reversed or changed, it can be used as the meaning including the concept depending on the direction of the corresponding relative terms.

Although the singular form is used in this specification, it should be noted that the singular form can be used as the concept representing the plural form unless being contradictory to the concept of the invention or clearly interpreted otherwise. It should be understood that the terms such as "having", "including", and "comprising" used herein do not preclude existence or addition of one or more other features or elements or combination thereof.

The drawings referred to in this specification are ideal exemplary drawings for describing the embodiments of the present invention, and shape, size, and thickness may be overdrawn for effective description of technical contents.

Hereinafter, a semiconductor device and a manufacturing method thereof in accordance with embodiments of the present invention will be described in detail with reference to the accompanying drawings.

Figure 1B:
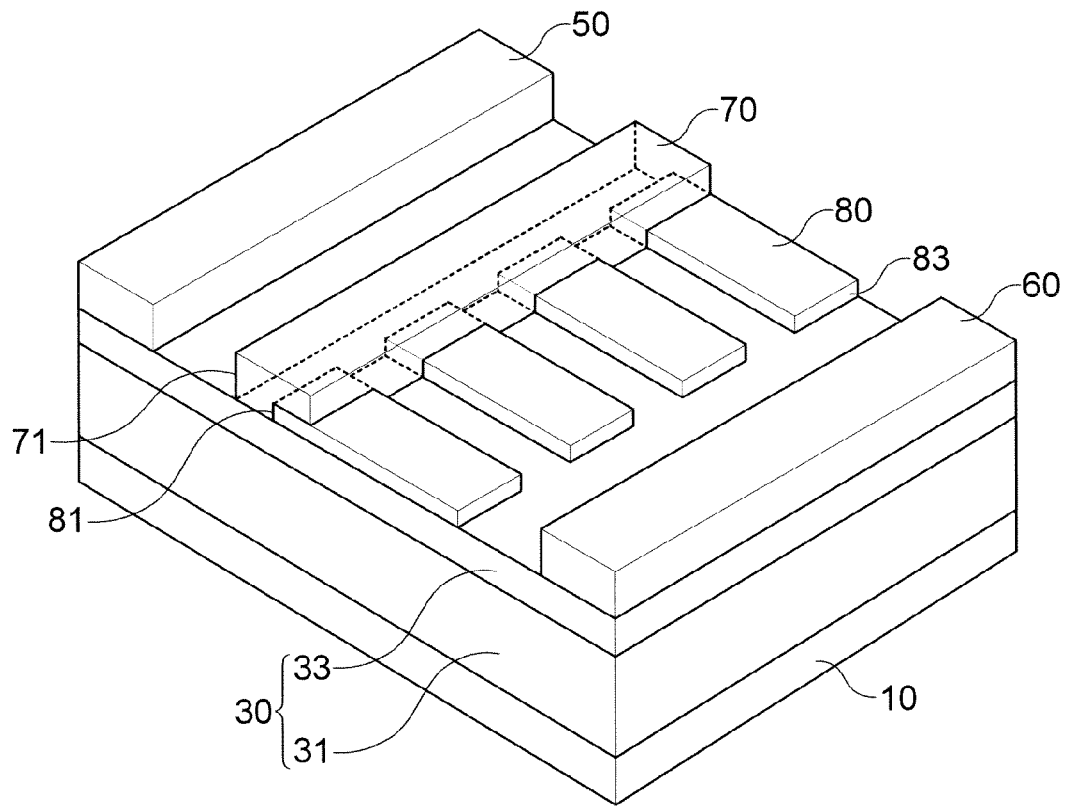
Figure 2:
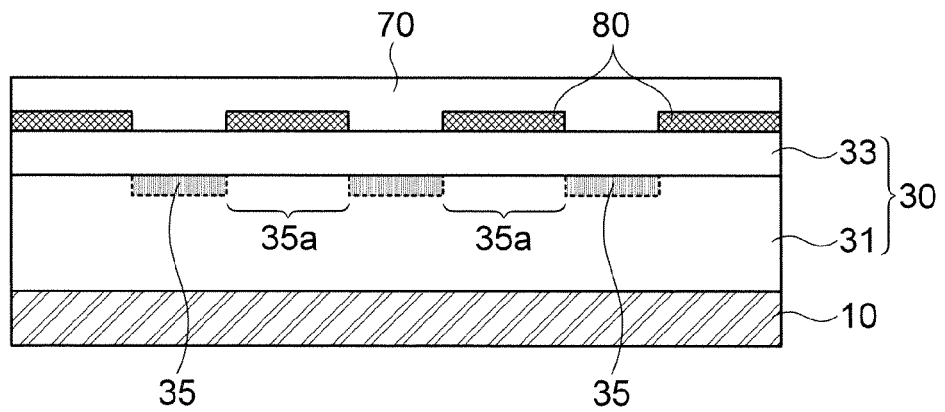
Figure 4:
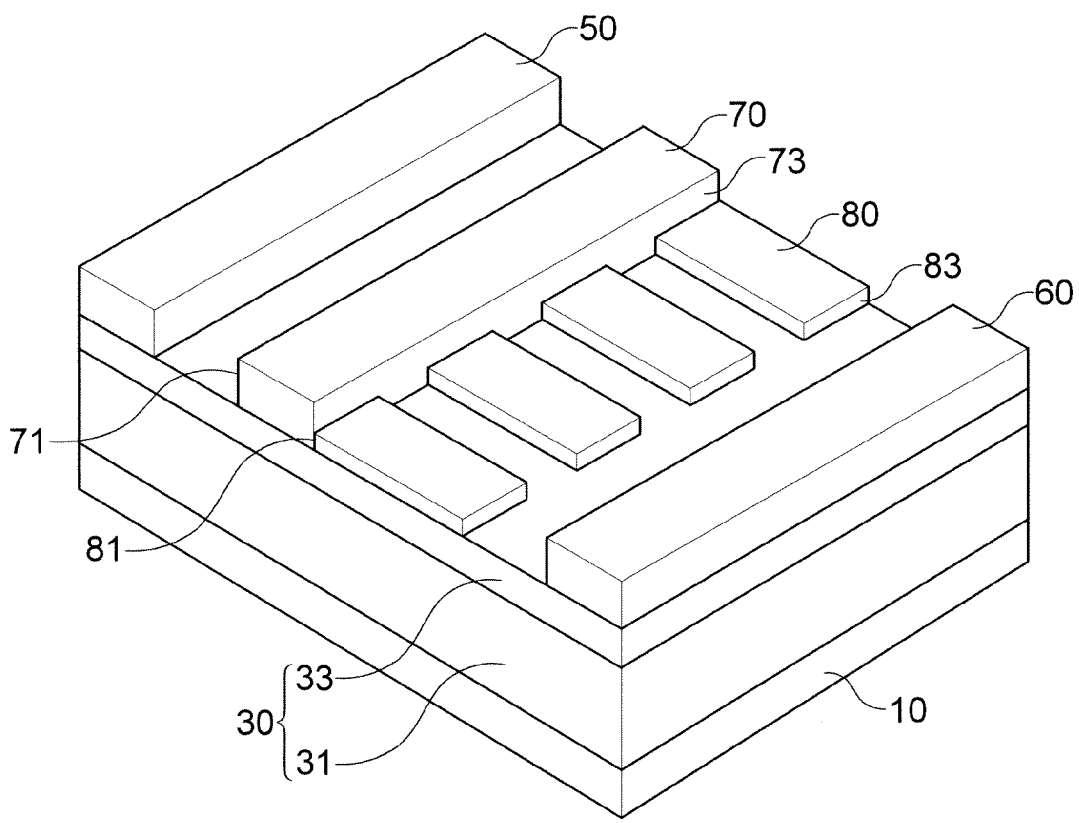
FIG. 4 is a schematic view of a nitride semiconductor device in accordance with another embodiment of the present invention.
Figure 5A:
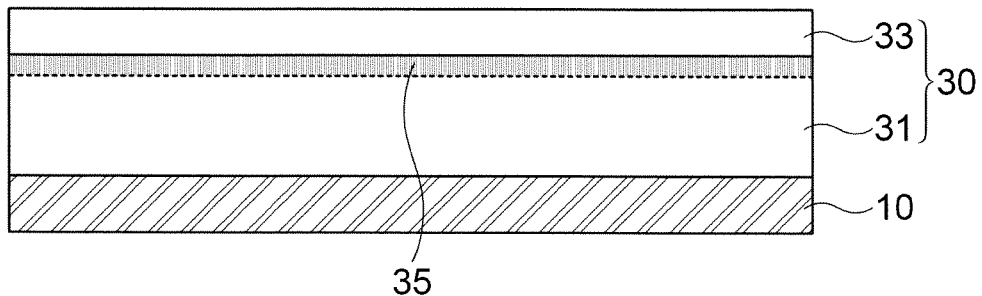
FIGS. 5a to 5d are views schematically showing a method of manufacturing the nitride semiconductor device in accordance with FIG. 4.
Figure 5B:
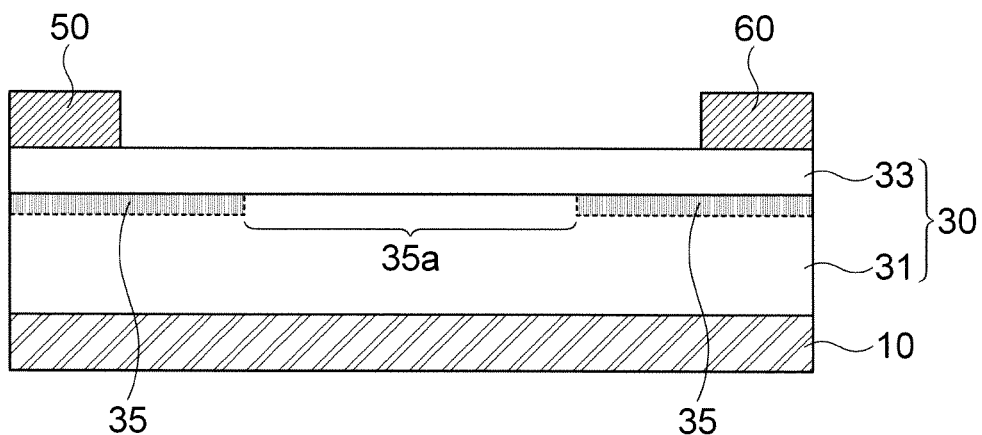
Figure 5C:
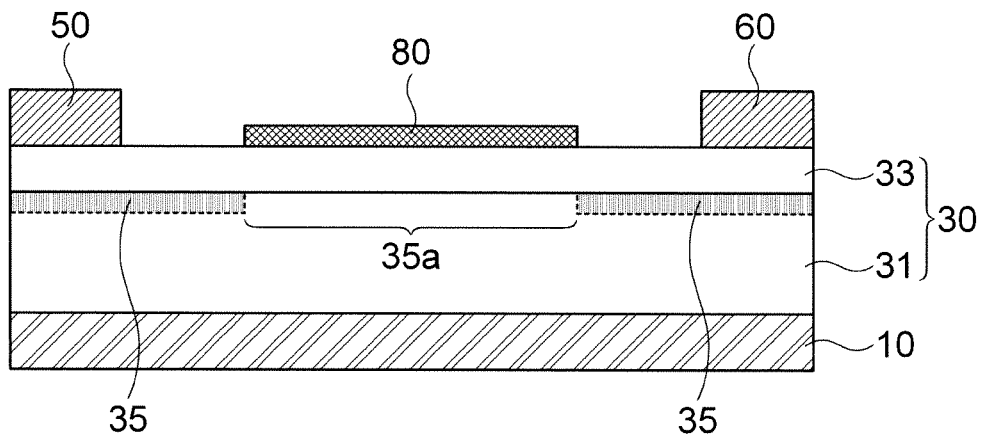
Figure 6:
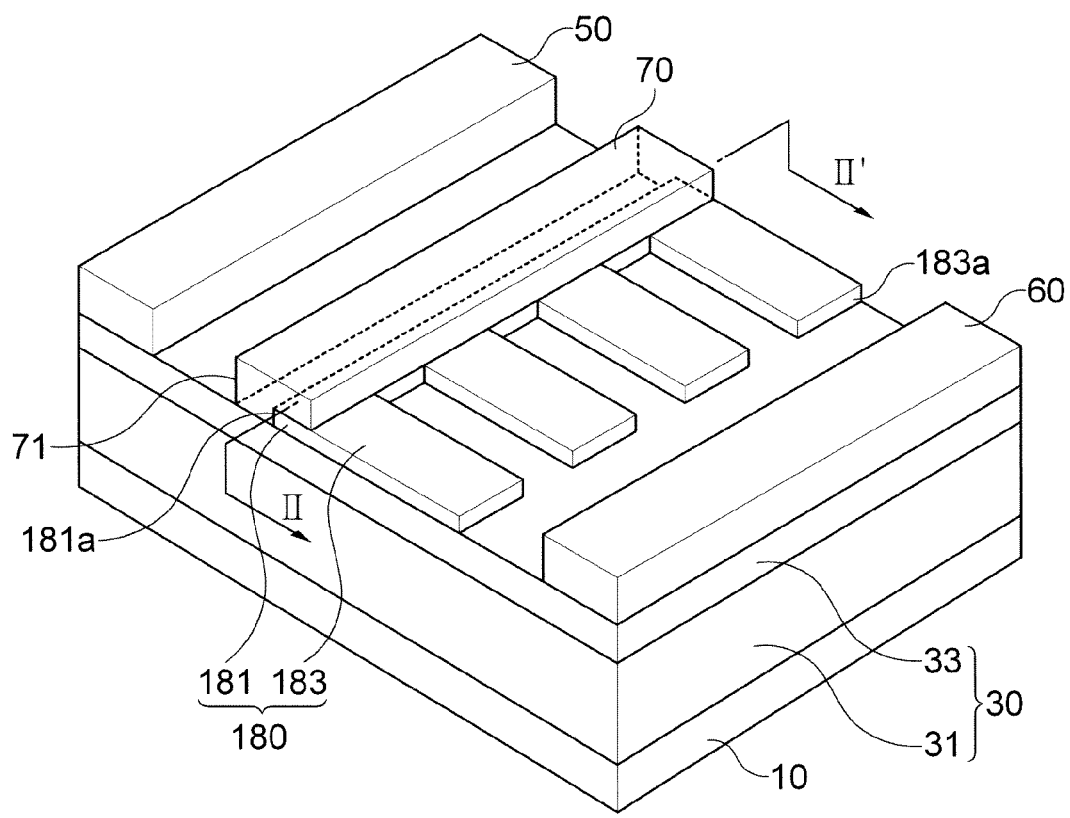
FIG. 6 is a schematic view of a nitride semiconductor device in accordance with still another embodiment of the present invention.
Figure 7:
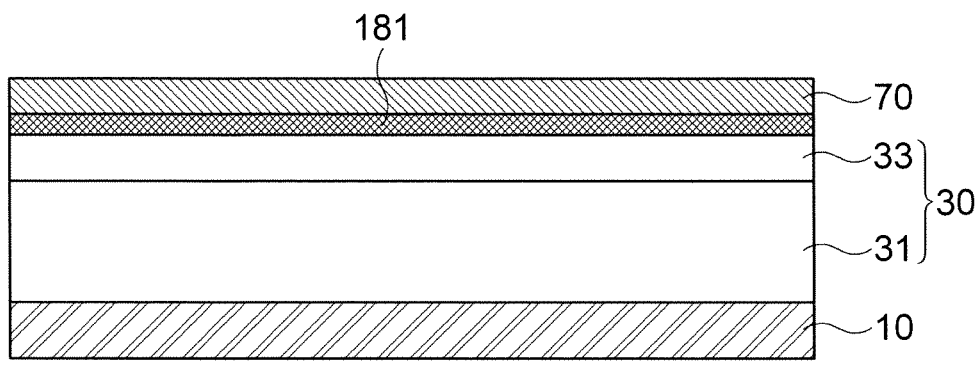
FIG. 7 is a schematic cross-sectional view showing the cross section taken along line II-II' in FIG. 6.

FIGS. 1a and 1b are schematic views of a nitride semiconductor device in accordance with an embodiment of the present invention. FIG. 2 is a schematic cross-sectional view showing the cross section taken along line I-I' in FIG. 1a. FIGS. 3a to 3d are views schematically showing a method of manufacturing the nitride semiconductor device in accordance with FIG. 1a. FIG. 4 is a schematic view of a nitride semiconductor device in accordance with another embodiment of the present invention. FIGS. 5a to 5d are views schematically showing a method of manufacturing the nitride semiconductor device in accordance with FIG. 4. FIG. 6 is a schematic view of a nitride semiconductor device in accordance with still another embodiment of the present invention. FIG. 7 is a schematic cross-sectional view showing the cross section taken along line II-II' in FIG. 6. FIGS. 8a to 8d are views schematically showing a method of manufacturing the nitride semiconductor device in accordance with FIG. 6.

Referring to FIGS. 1a and 1b, a nitride semiconductor device in accordance with a first embodiment of the present invention includes a nitride semiconductor layer 30, a source electrode 50, a drain electrode 60, a plurality of p-type nitride semiconductor segments 80, and a gate electrode 70. For example, the nitride semiconductor device is a horizontal nitride HFET having 2DEG.

Referring to FIGS. 1a and 1b, the nitride semiconductor layer 30 is formed by a heterojunction of a first nitride layer 31 and a second nitride layer 33 which includes a material with a wider energy band gap than a material of the first nitride layer 31. A two-dimensional electron gas (2DEG) channel 35 is formed near a junction interface of the nitride semiconductor layer 30. The nitride semiconductor layer 30 is a heterojunction gallium nitride semiconductor layer 30, and the 2DEG channel 35 is formed on the heterojunction interface by an energy band gap difference. The less the difference in lattice constant between heterojunctions in the heterojunction gallium nitride semiconductor layer 30 is, the less the differences in band gap and polarity are. Due to this, the formation of the 2DEG channel 35 may be suppressed. Free electrons move from a material with a wide band gap to a material with a small band gap by discontinuity of the energy band gap during heterojunction. These electrons are accumulated on the heterojunction interface to form the 2DEG channel 35 so that current flows between the drain electrode 60 and the source electrode 50.

The nitride semiconductor layer 30 includes the first nitride layer 31 and the second nitride layer 33. The second nitride layer 33 is in heterojunction with the first nitride layer 31 and includes a heterogeneous gallium nitride material with a wider energy band gap than the first nitride layer 31. At this time, the second nitride layer 33 plays a role of supplying electrons to the 2 DEG channel 35 formed in the first nitride layer 31. In an example, the second nitride layer 33, which donates electrons, may be formed with a thickness smaller than that of the first nitride layer 31.

In an example, a nitride constituting the nitride semiconductor layer 30 may be gallium nitride (GaN), aluminum gallium nitride (AlGaN), indium gallium nitride (InGaN), or indium aluminum gallium nitride (InAlGaN) but not limited thereto. Further, in an example, the first nitride layer 31 may include gallium nitride (GaN), and the second nitride layer 33 may include one of aluminum gallium nitride (AlGaN), indium gallium nitride (InGaN), and indium aluminum gallium nitride (InAlGaN). For example, the material of the first nitride layer 31 may include gallium nitride (GaN), and the material of the second nitride layer 33 may include (AlGaN).

Figure 3D:
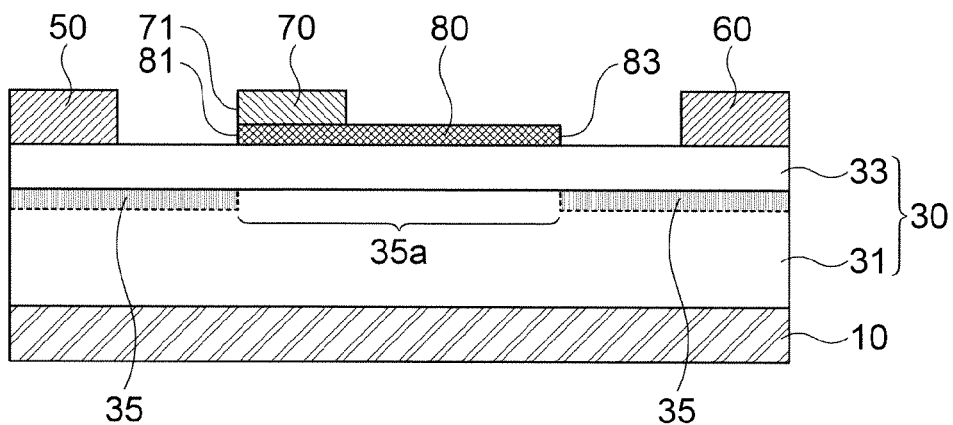

In accordance with an example, as shown in FIG. 3d, the first nitride layer 31 of the nitride semiconductor layer 30 may be disposed on a substrate 10. At this time, generally, the substrate 10 may be an insulating substrate or a high resistance substrate substantially having insulation property. For example, the substrate 10 may be manufactured using at least one of silicon (Si), silicon carbide (SiC), and sapphire (Al$_2$O$_3$) or other well-known substrate materials.

The nitride semiconductor layer 30 may be directly formed on the substrate 10. At this time, in an example, the nitride semiconductor layer 30 may be formed by epitaxially growing a single crystal thin film. In accordance with another example, although not shown, a buffer layer may be provided between the substrate 10 and the nitride semiconductor layer 30, and the nitride semiconductor layer 30 may be formed on the buffer layer. For example, the buffer layer is provided so as to overcome problems due to a lattice mismatch between the substrate 10 and the nitride semiconductor layer 30. The buffer layer may be formed in one layer as well as a plurality of layers including gallium nitride (GaN), aluminum gallium nitride (AlGaN), aluminum nitride (AlN), indium gallium nitride (InGaN) or indium aluminum gallium nitride (InAlGaN). Further, the buffer layer may be made of group III-V compound semiconductors other than gallium nitride. For example, when the substrate 10 is a sapphire substrate, growth of the buffer layer is important to avoid a mismatch due to differences in lattice constant and coefficient of thermal expansion between the substrate 10 and the nitride semiconductor layer 30 including gallium nitride.

Again, referring to FIGS. 1a and 1b, the source electrode 50 is in ohmic contact with the nitride semiconductor layer 30.

Further, referring to FIGS. 1a and 1b, the drain electrode 60 is in ohmic contact with the nitride semiconductor layer 30 while being spaced apart from the source electrode 50.

At this time, the source electrode 50 and the drain electrode 60 may be formed using metal, metal silicide, or alloys thereof. For example, the source electrode 50 and the drain electrode 60 may be formed using at least one metal of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn), metal silicide, and alloys thereof. Further, in an example, the source electrode 50 and the drain electrode 60 may be made of the same material.

Continuously, referring to FIGS. 1a and 1b, the plurality of p-type nitride semiconductor segments 80 are formed on the nitride semiconductor layer 30 between the source and drain electrodes 50 and 60. At this time, each of the p-type nitride semiconductor segments 80 is formed lengthways from a source-side first sidewall 81, which is spaced apart from the source electrode 50 by a predetermined distance, to a drain side. Referring to FIG. 2, the plurality of p-type nitride semiconductor segments 80 are disposed at predetermined intervals, and at this time, below the p-type nitride semiconductor segments 80, the 2DEG channel 35 is disconnected due to depletion 35a of 2DEG of the nitride semiconductor layer 30.

In an example, a material of the p-type nitride semiconductor segments 80 may be a material obtained by doping gallium nitride (GaN), aluminum gallium nitride (AlGaN), indium gallium nitride (InGaN), or indium aluminum gallium nitride (InAlGaN) as p-type but not limited thereto. At this time, in accordance with an example, the p-type nitride semiconductor segments 80 may be made of a p-type semiconductor material obtained by doping the material of the first nitride layer 31 as p-type. For example, the material of the first nitride layer 31 may include gallium nitride (GaN), and the p-type nitride semiconductor segments 80 may be made of a p-GaN material.

In an embodiment of the present invention, since the 2DEG below the p-type nitride semiconductor segments 80, for example, a p-GaN segment, is depleted 35a and configured to cross with the 2DEG in a portion without the p-type nitride semiconductor segments 80, the 2DEG channel 35 and the p-type nitride semiconductor segments 80, for example, p-GaN, are depleted together to be intrinsic so that it is possible to implement a high withstand voltage due to high channel resistance. Further, it is possible to reduce a distance between the gate electrode 70 and the drain electrode 60 as much as the withstand voltage of the device in accordance with an embodiment of the present invention is improved, thereby reducing on-resistance.

In accordance with an example, in order to effectively deplete the 2DEG in turn-off, it is possible to adjust a doping density of the p-type nitride semiconductor segments 80, an interval between the segments 80, and size of the segments 80.

Further, in an example, it is possible to obtain a high current and high withstand voltage device by disposing the 2DEG portion 35 and a portion 35a, which offsets the 2DEG and forms two-dimensional hole gas (2DHG) or p+ semiconductor, between the drain electrode 60 and the gate electrode 70 to cross each other in the direction parallel to a current flow. At this time, in an example, as an example of a layer which offsets 2DEG and forms 2DHG or P+ semiconductor, there is p-GaN. At this time, in turn-on, 2DEG and 2DHG operate as carriers at the same time to reduce on-resistance, and in turn-off, 2DEG and 2DHG, which are configured to cross each other, are depleted together to prevent electric field concentration of the gate electrode 70. Further, a structure of another embodiment, which depletes the 2DEG below and forms a p+ type carrier thereon, may be used.

In an example, as shown in FIG. 1a, the first sidewalls 81 of the p-type nitride semiconductor segments 80 may be aligned to coincide with a source-side sidewall 71 of the gate electrode 70 or as shown in FIG. 1b, the first sidewalls 81 of the p-type nitride semiconductor segments 80 may be aligned not to reach the source-side sidewall 71 of the gate electrode 70.

Further, in an example, as shown in FIGS. 1a and 1b, drain-side second sidewalls 83 of the p-type nitride semiconductor segments 80 may be spaced apart from the drain electrode 60 by a predetermined distance or although not shown, the drain-side second sidewalls 83 of the p-type nitride semiconductor segments 80 may be in contact with the drain electrode 60. In accordance with an example, it may be preferred that the drain-side second sidewalls 83 of the p-type nitride semiconductor segments 80 are spaced apart from the drain electrode 60 by a predetermined distance.

And, referring to FIGS. 1a and 1b, the gate electrode 70 is formed between the source and drain electrodes 50 and 60 to be close to the source electrode 50. At this time, a portion of the gate electrode 70 is in contact with the nitride semiconductor layer 30 between the plurality of p-type nitride semiconductor segments 80. At this time, the gate electrode 70 may be in Schottky contact. Further, at this time, the source-side sidewall 71 of the gate electrode 70 is aligned with each of the first sidewalls 81 of the p-type nitride semiconductor segments 80. Further, in an example, the first sidewall 81 of each of the p-type nitride semiconductor segments 80 aligned with the source-side sidewall 71 of the gate electrode 70 may be aligned to coincide with the source-side sidewall 71 of the gate electrode 70 as shown in FIG. a or may be aligned not to reach the source-side sidewall 71 of the gate electrode 70 as shown in FIG. 1b.

Continuously, referring to FIGS. 1a and 1b, another portion of the gate electrode 70 is in contact with a portion of each of p-type nitride semiconductor segments 80. At this time, the gate electrode 70 may be in Schottky contact. Each of the p-type nitride semiconductor segments 80, which is in contact with a lower portion of the gate electrode 70, extends in the direction of the source-side sidewall 71 of the gate electrode 70.

For example, the gate electrode 70 may be formed using metal, metal silicide, or alloys thereof. For example, the gate electrode may be formed using at least one metal of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn), metal silicide, and alloys thereof, which are capable of Schottky junction. Further, in an example, the Schottky-contacted gate electrode 70 may be made of a different material from the ohmic-contacted source electrode 50 and drain electrode 60.

In accordance with an embodiment of the present invention, it is possible to implement a super-junction effect, which is implemented by a silicon FET, by a nitride high electron mobility transistor, for example, a GaN HFET.

In accordance with this embodiment, it is possible to promote partial removal of 2DEG and formation of 2DHG or a p-type semiconductor layer by forming portions of the p-type nitride semiconductor segments 80, which is connected to the gate electrode 70, between the gate electrode 70 and the drain electrode 60 on the nitride semiconductor layer 30 having the 2DEG channel 35.

Next, a nitride semiconductor device in accordance with a second embodiment of the present invention will be described with reference to FIG. 4. At this time, in describing this embodiment, configuration overlapping with that of the nitride semiconductor device in accordance with the above-described first embodiment will refer to the above-described first embodiment, and accordingly, repeated description will be omitted.

Referring to FIG. 4, a nitride semiconductor device in accordance with a second embodiment includes a nitride semiconductor layer 30, a source electrode 50, a drain electrode 60, a plurality of p-type nitride semiconductor segments 80, and a gate electrode 70. For example, the nitride semiconductor device is a horizontal nitride HFET having 2DEG.

At this time, referring to FIG. 4, the nitride semiconductor layer 30 is formed by a heterojunction of a first nitride layer 31 and a second nitride layer 33 which includes a material with a wider energy band gap than a material of the first nitride layer 31. A two-dimensional electron gas (2DEG) channel 35 is formed near a junction interface of the nitride semiconductor layer 30. The second nitride layer 33 in heterojunction with the first nitride layer 31 includes a heterogeneous gallium nitride material with a wider energy band gap than the first nitride layer 31. At this time, the second nitride layer 33 plays a role of supplying electrons to the 2DEG channel 35 formed in the first nitride layer 31. In an example, the second nitride layer 33, which donates electrons, is formed with a thickness smaller than that of the first nitride layer 31.

In an example, a nitride constituting the nitride semiconductor layer 30 may be gallium nitride (GaN), aluminum gallium nitride (AlGaN), indium gallium nitride (InGaN), or indium aluminum gallium nitride (InAlGaN) but not limited thereto. For example, the first nitride layer 31 may include gallium nitride (GaN), and the second nitride layer 33 may include one of aluminum gallium nitride (AlGaN), indium gallium nitride (InGaN), and indium aluminum gallium nitride (InAlGaN). In an example, the material of the first nitride layer 31 may include gallium nitride (GaN), and the material of the second nitride layer 33 may include aluminum gallium nitride (AlGaN).

Figure 5D:
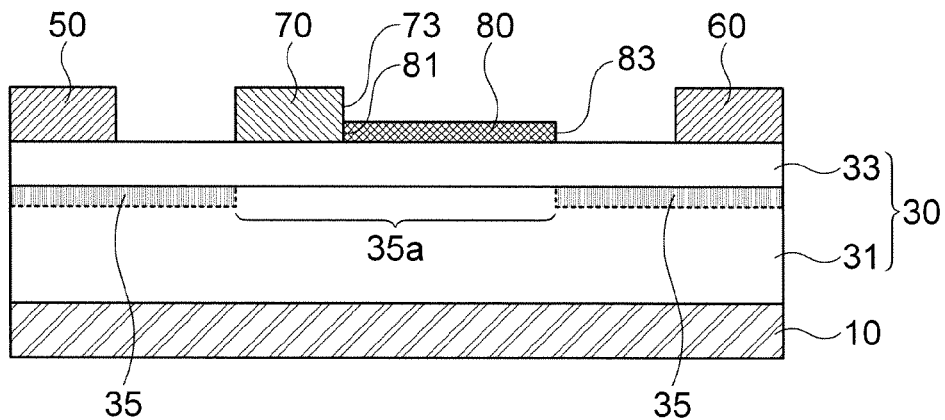

In accordance with an example, as shown in FIG. 5d, the first nitride layer 31 of the nitride semiconductor layer 30 may be disposed on a substrate 10. At this time, the substrate 10 may be manufactured using at least one of silicon (Si), silicon carbide (SIC), and sapphire ($Al_2O_3$) or other well-known substrate materials. Further, in accordance with an example, although not shown, a buffer layer may be provided between the substrate 10 and the nitride semiconductor layer 30, and the nitride semiconductor layer 30 may be formed on the buffer layer. Further, the buffer layer may be formed in one layer as well as a plurality of layers containing gallium nitride (GaN), aluminum gallium nitride (AlGaN), aluminum nitride (AlN), indium gallium nitride (InGaN), or indium aluminum gallium nitride (InAlGaN).

Again, referring to FIG. 4, the source electrode 50 is in ohmic contact with the nitride semiconductor layer 30, and the drain electrode 60 is in ohmic contact with the nitride semiconductor layer 30 while being spaced apart from the source electrode 50.

For example, the source electrode 50 and the drain electrode 60 may be formed using metal, metal silicide, or alloys thereof. Further, in an example, the source electrode 50 and the drain electrode 60 may be made of the same material.

Continuously, referring to FIG. 4, the plurality of p-type nitride semiconductor segments 80 are formed on the nitride semiconductor layer 30 between the source and drain electrodes 50 and 60. At this time, each of the p-type nitride semiconductor segments 80 is formed lengthways from a source-side first sidewall 81, which is spaced apart from the source electrode 50 by a predetermined distance, to a drain side. By cutting FIG. 4 in the direction of I-I' as in FIG. 1a, it is possible to obtain a cross section like FIG. 2. Referring to FIG. 2, the plurality of p-type nitride semiconductor segments 80 are disposed at predetermined intervals, and at this time, below the p-type nitride semiconductor segments 80, the 2DEG channel 35 is disconnected.

In an example, a material of the p-type nitride semiconductor segments 80 may be a material obtained by doping gallium nitride (GaN), aluminum gallium nitride (AlGaN), indium gallium nitride (InGaN), or indium aluminum gallium nitride (InAlGaN) as p-type but not limited thereto. At this time, in accordance with an example, the p-type nitride semiconductor segments 80 may be made of a p-type semiconductor material obtained by doping the material of the first nitride layer 31 as p-type. For example, the material of the first nitride layer 31 may include gallium nitride (GaN), and the p-type nitride semiconductor segments 80 may be made of a p-GaN material.

In an embodiment of the present invention, since 2DEG below the p-type nitride semiconductor segments 80, for example, a p-GaN segment, is depleted 35a and configured to cross with 2DEG in a portion without the p-type nitride semiconductor segments 80, the 2DEG channel 35 and the p-type nitride semiconductor segments 80 are depleted together so that it is possible to implement a high withstand voltage due to high channel resistance. Further, it is possible to reduce a distance between the gate electrode 70 and the drain electrode 60 as much as the withstand voltage of the device in accordance with an embodiment of the present invention is improved, thereby reducing on-resistance.

In accordance with an example, in order to effectively deplete the 2DEG in turn-off, it is possible to adjust a doping density of the p-type nitride semiconductor segments 80, an interval between the segments 80, and size of the segments 80.

Further, in an example, it is possible to obtain a high current and high withstand voltage device by disposing the 2DEG portion 35 and a portion 35a, which offsets the 2DEG and forms two-dimensional hole gas (2DHG) or P+ semiconductor, between the drain electrode 60 and the gate electrode 70 to cross each other in the direction parallel to a current flow. At this time, in an example, as an example of a layer which offsets 2DEG and forms 2DHG, there is p-GaN. At this time, in turn-on, 2DEG and 2DHG operate as carriers at the same time to reduce on-resistance, and in turn-off, 2DEG and 2DHG, which are configured to cross each other, are depleted together to prevent electric field concentration of the gate electrode 70. Further, a structure of another embodiment, which depletes the 2DEG below and forms a p+ type carrier thereon, may be used.

Further, in an example, as shown in FIG. 4, drain-side second sidewalls 83 of the p-type nitride semiconductor segments 80 may be spaced apart from the drain electrode 60 by a predetermined distance or in another example, although not shown, the drain-side second sidewalls 83 of the p-type nitride semiconductor segments 80 may be in contact with the drain electrode 60. In accordance with an example, it may be preferred that the drain-side second sidewalls 83 of the p-type nitride semiconductor segments 80 are spaced apart from the drain electrode by a predetermined distance.

And, referring to FIG. 4, the gate electrode 70 is formed on the nitride semiconductor layer 30 between the source and drain electrodes 50 and 60 to be close to the source electrode 50. At this time, the gate electrode 70 may be in Schottky contact. Further, a drain-side sidewall of the gate electrode 70 is in contact with the first sidewalls 81 of the p-type nitride semiconductor segments 80.

For example, the gate electrode 70 may be formed using metal, metal silicide, or alloys thereof. Further, in an example, the Schottky-contacted gate electrode 70 may be made of a different material from the ohmic-contacted source electrode 50 and drain electrode 60.

Next, a nitride semiconductor device in accordance with a third embodiment of the present invention will be described with reference to FIG. 6. At this time, in describing this embodiment, configuration overlapping with that of the nitride semiconductor device in accordance with the above-described first and second embodiments will refer to the above-described first and second embodiments, and accordingly, repeated description will be omitted.

Referring to FIG. 6, a nitride semiconductor device in accordance with a third embodiment includes a nitride semiconductor layer 30, a source electrode 50, a drain electrode 60, a p-type nitride semiconductor structure 180, and a gate electrode 70. For example, the nitride semiconductor device is a horizontal nitride HFET having 2DEG.

At this time, referring to FIG. 6, the nitride semiconductor layer 30 is formed by a heterojunction of a first nitride layer 31 and a second nitride layer 33 which includes a material with a wider energy band gap than a material of the first nitride layer 31. A two-dimensional electron gas (2DEG) channel 35 is formed near a junction interface of the nitride semiconductor layer 30. The second nitride layer 33 in heterojunction with the first nitride layer 31 includes a heterogeneous gallium nitride material with a wider energy band gap than the first nitride layer 31. At this time, the second nitride layer 33 plays a role of supplying electrons to the 2 DEG channel 35 formed in the first nitride layer 31. In an example, the second nitride layer 33, which donates electrons, is formed with a thickness smaller than that of the first nitride layer 31.

In an example, a nitride constituting the nitride semiconductor layer 30 may be gallium nitride (GaN), aluminum gallium nitride (AlGaN), indium gallium nitride (InGaN), or indium aluminum gallium nitride (InAlGaN) but not limited thereto. For example, the first nitride layer 31 may include gallium nitride (GaN), and the second nitride layer 33 may include one of aluminum gallium nitride (AlGaN), indium gallium nitride (InGaN), and indium aluminum gallium nitride (InAlGaN). In an example, the material of the first nitride layer 31 may include gallium nitride (GaN), and the material of the second nitride layer 33 may include aluminum gallium nitride (AlGaN).

Figure 8A:
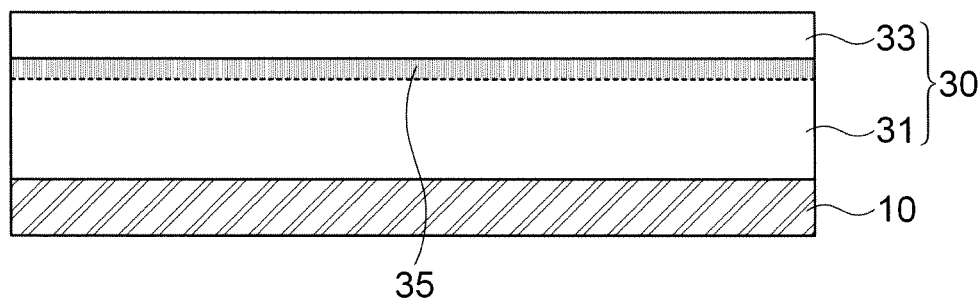
FIGS. 8a to 8d are views schematically showing a method of manufacturing the nitride semiconductor device in accordance with FIG. 6.
Figure 8B:
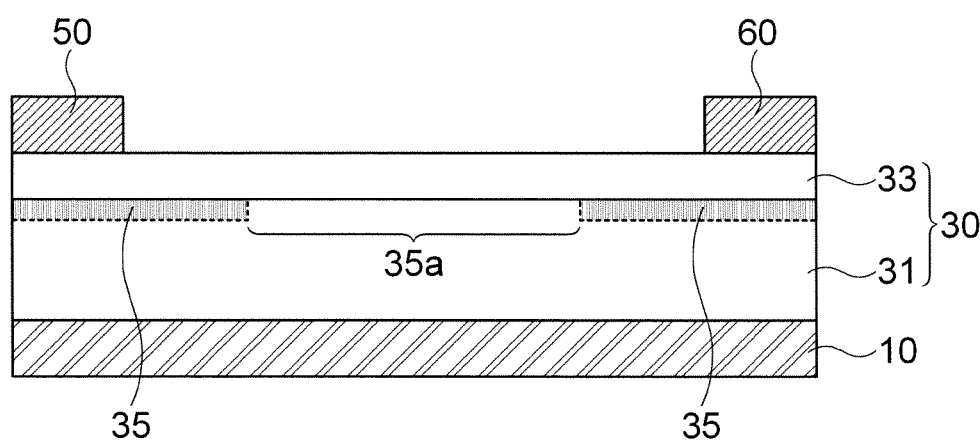
Figure 8C:
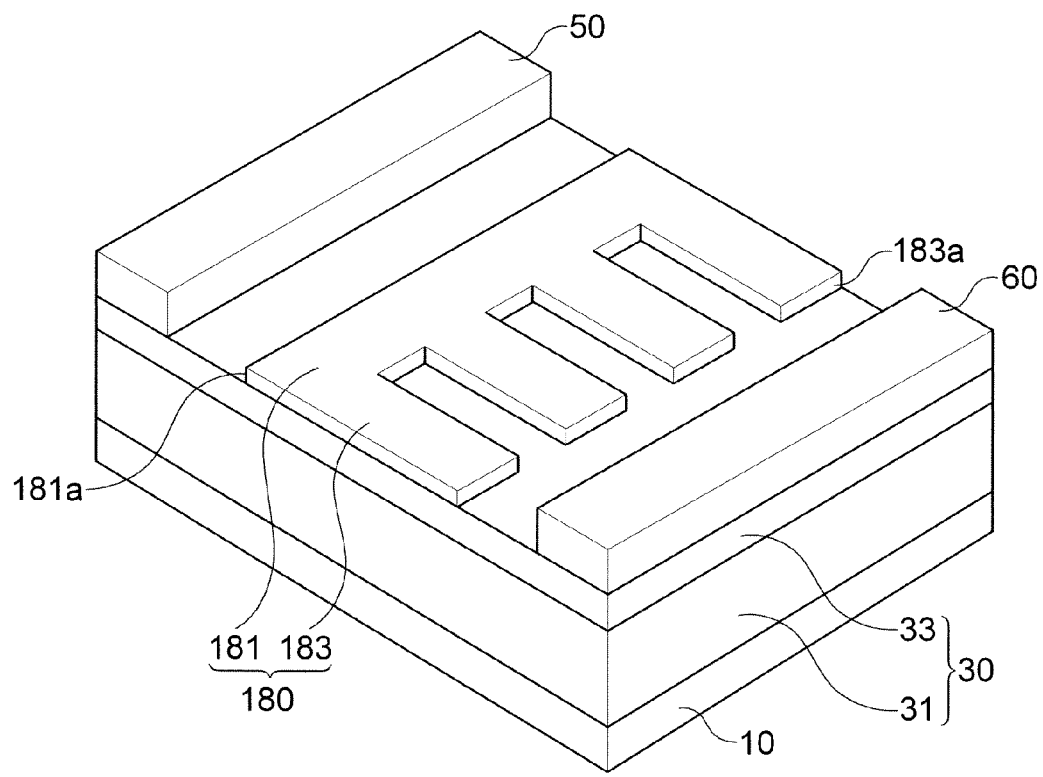
Figure 8D:
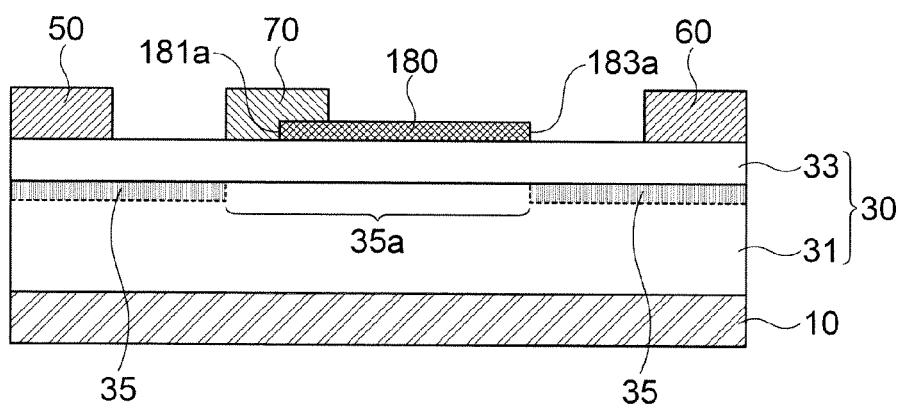

In accordance with an example, as shown in FIG. 8d, the first nitride layer 31 of the nitride semiconductor layer 30 may be disposed on a substrate 10. At this time, the substrate 10 may be manufactured using at least one of silicon (Si), silicon carbide (SiC), and sapphire ($Al_2O_3$) or other well-known substrate materials. Further, in accordance with an example, although not shown, a buffer layer may be provided between the substrate 10 and the nitride semiconductor layer 30, and the nitride semiconductor layer 30 may be formed on the buffer layer. Further, the buffer layer may be formed in one layer as well as a plurality of layers including gallium nitride (GaN), aluminum gallium nitride (AlGaN), aluminum nitride (AlN), indium gallium nitride (InGaN) or indium aluminum gallium nitride (InAlGaN).

Again, referring to FIG. 6, the source electrode 50 is in ohmic contact with the nitride semiconductor layer 30, and the drain electrode 60 is in ohmic contact with the nitride semiconductor layer 30 while being spaced apart from the source electrode 50.

For example, the source electrode 50 and the drain electrode 60 may be formed using metal, metal silicide, or alloys thereof. Further, in an example, the source electrode 50 and the drain electrode 60 may be made of the same material.

Continuously, referring to FIG. 6, the p-type nitride semiconductor structure 180 is formed on the nitride semiconductor layer 30 between the source and drain electrodes 50 and 60. At this time, the p-type nitride semiconductor structure 180 includes a trunk portion 181 and a plurality of branch segments 183. The trunk portion 181 of the p-type nitride semiconductor structure 180 is spaced apart from the source electrode 50 in parallel by a predetermined distance. The plurality of branch segments 183 of the p-type nitride semiconductor structure 180 are formed lengthways from the trunk portion 181 to a drain side. Referring to FIG. 7, below the trunk portion 181 of the p-type nitride semiconductor structure 180, the 2DEG channel 35 of the nitride semiconductor layer 30 is disconnected. Further, by cutting FIG. 6 in the direction of I-I' as in FIG. 1a, it is possible to obtain a cross section like FIG. 2. The branch segments 183 of the p-type nitride semiconductor structure 180 are disposed at predetermined intervals, and at this time, below the branch segments 183 of the p-type nitride semiconductor structure 180, the 2DEG channel 35 of the nitride semiconductor layer 30 is disconnected.

In an example, a material of the p-type nitride semiconductor structure 180 may be a material obtained by doping gallium nitride (GaN), aluminum gallium nitride (AlGaN), indium gallium nitride (InGaN), or indium aluminum gallium nitride (InAlGaN) as p-type but not limited thereto. At this time, in accordance with an example, the p-type nitride semiconductor 180 may be made of a p-type semiconductor material obtained by doping the material of the first nitride layer 31 as p-type. For example, the material of the first nitride layer 31 may include gallium nitride (GaN), and the p-type nitride semiconductor structure 180 may be made of a p-GaN material.

In an embodiment of the present invention, since 2DEG below the branch segments 183 of the p-type nitride semiconductor structure 180 is depleted (refer to 35a of FIG. 2) and configured to cross with 2DEG in a portion without the branch segments 183 of the p-type nitride semiconductor structure 180, the 2DEG channel 35 and the branch segments 183 of the p-type nitride semiconductor structure 180 are depleted together so that it is possible to implement a high withstand voltage due to high channel resistance. Further, it is possible to reduce a distance between the gate electrode 70 and the drain electrode 60 as much as the withstand voltage of the device in accordance with an embodiment of the present invention is improved, thereby reducing on-resistance.

In accordance with an example, in order to effectively deplete the 2DEG in turn-off, it is possible to adjust a doping density of the branch segments 183 of the p-type nitride semiconductor structure 180, an interval between the segments 183, and size of the segments 183.

Further, in an example, it is possible to obtain a high current and high withstand voltage device by disposing the 2DEG portion and portion 35a, which offsets 2DEG and forms two-dimensional hole gas (2DHG) or p+ semiconductor, between the drain electrode 60 and the gate electrode 70 to cross each other in the direction parallel to a current flow. At this time, in an example, as an example of a layer which offsets 2DEG and forms 2DHG, there is p-GaN. At this time, in turn-on, 2DEG and 2DHG operate as carriers at the same time to reduce on-resistance, and in turn-off, 2DEG and 2DHG, which are configured to cross each other, are depleted together to prevent electric field concentration of the gate electrode 70. Further, a structure of another embodiment, which depletes the 2DEG below and forms a P+ type carrier thereon, may be used.

Further, in an example, as shown in FIG. 6, drain-side second sidewalls 183a of the branch segments 183 of the p-type nitride semiconductor structure 180 may be spaced apart from the drain electrode 60 by a predetermined distance or in another example, although not shown, the drain-side second sidewalls 183a of the branch segments 183 of the p-type nitride semiconductor structure 180 may be in contact with the drain electrode 60. In accordance with an example, it may be preferred that the drain-side second sidewalls 183a of the branch segments 183 of the p-type nitride semiconductor structure 180 is spaced apart from the drain electrode 60 by a predetermined distance.

And, referring to FIG. 6, the gate electrode 70 is formed between the source and drain electrodes 50 and 60 to be close to the source electrode 50. At this time, a portion of the gate electrode 70 is in contact with the nitride semiconductor layer 30, and another portion of the gate electrode 70 is in contact with the trunk portion 181 of the p-type nitride semiconductor structure 180. Further, at this time, the gate electrode 70 may be in Schottky contact. Further, a source-side sidewall 71 of the gate electrode 70 is aligned with a source-side first sidewall 181a of the trunk portion 181 of the p-type nitride semiconductor structure 180, and the trunk portion 181 of the p-type nitride semiconductor structure 180 in contact with a lower portion of the gate electrode 70 is formed not to reach the source-side sidewall 71 of the gate electrode 70.

For example, the gate electrode 70 may be formed using metal, metal silicide, or alloys thereof. Further, in an example, the Schottky-contacted gate electrode 70 may be made of a different material from the ohmic-contacted source electrode 50 and drain electrode 60.

Next, a method of manufacturing a nitride semiconductor device in accordance with a fourth embodiment of the present invention will be described with reference to FIGS. 3a to 3d. The fourth embodiment of the present invention relates to a method of manufacturing the nitride semiconductor device in accordance with the above-described first embodiment and refers to the above-described first embodiment and FIGS. 1a and 1b. Accordingly, repeated description will be omitted.

Referring to FIGS. 3a to 3d, a method of manufacturing a nitride semiconductor device includes a heterojunction nitride semiconductor layer forming step (FIG. 3a), a source and drain electrode and p-type nitride semiconductor segment forming step (FIGS. 3b and 3c), and a gate electrode forming step (FIG. 3d). At this time, the source and drain electrode and p-type nitride semiconductor segment forming step (FIGS. 3b and 3c) may sequentially perform the source and drain electrode forming step (FIG. 3b) and the p-type nitride semiconductor segment forming step (FIG. 3c) or perform the source and drain electrode forming step (FIG. 3b) after performing the p-type nitride semiconductor segment forming step (FIG. 3c) in reverse order.

First, referring to FIG. 3a, in the heterojunction nitride semiconductor layer forming step, a first nitride layer 31 is hetero-joined to a second nitride layer 33 which includes a material with a wider energy band gap than a material of the first nitride layer 31. According to heterojunction, a two-dimensional electron gas (2DEG) channel is formed near a junction interface. The second nitride layer 33 plays a role of supplying electrons to the 2DEG channel 35 in the first nitride layer 31. In an example, the second nitride layer 33, which donates electrons, may be formed with a thickness smaller than that of the first nitride layer 31.

In an example, a nitride used in a nitride semiconductor layer 30 may be gallium nitride (GaN), aluminum gallium nitride (AlGaN), indium gallium nitride (InGaN), or indium aluminum gallium nitride (InAlGaN) but not limited thereto. Further, in an example, the first nitride layer 31 may include gallium nitride (GaN), and the second nitride layer 33 may include one of aluminum gallium nitride (AlGaN), indium gallium nitride (InGaN), and indium aluminum gallium nitride (InAlGaN). For example, the material of the first nitride layer 31 may include gallium nitride (GaN), and the material of the second nitride layer 33 may include aluminum gallium nitride (AlGaN).

In an example, the nitride semiconductor layer 30 may be formed by epitaxially growing a nitride single crystal thin film. At this time, the first nitride layer 31 and the second nitride layer 33 are formed by an epitaxial growth process. For example, as shown in FIG. 3a, the first nitride layer 31 may be formed by epitaxially growing a gallium nitride single crystal thin film on a substrate 10. At this time, the substrate 10 may be manufactured using at least one of silicon (Si), silicon carbide (SiC), and sapphire ($Al_2O_3$) or other well-known substrate materials. Further, although not shown, the first nitride layer 31 may be epitaxially grown on a buffer layer after epitaxially growing the buffer layer on the substrate 10. Next, the second nitride layer 33 is formed by epitaxially growing a nitride layer including a heterogeneous gallium nitride material with a wider energy band gap than the first nitride layer 31 by using the first nitride layer 31 as a seed layer.

At this time, in an example, the first nitride layer 31 may be formed by epitaxially growing a gallium nitride single crystal including gallium nitride (GaN), and the second nitride layer 33 may be formed by epitaxially growing gallium nitride single crystal including one of aluminum gallium nitride (AlGaN), indium gallium nitride (InGaN), and indium aluminum gallium nitride (InAlGaN). For example, the second nitride layer 33 may be formed by epitaxially growing aluminum gallium nitride (AlGaN).

The first and second nitride layers 31 and 33 may be formed by an epitaxial growth process such as liquid phase epitaxy (LPE), chemical vapor deposition (CVD), molecular beam epixaxy (MBE), or metal-organic CVD (MOCVD). The nitride semiconductor layer 30 is selectively grown during the epitaxial growth so as not to be overgrown. If the nitride semiconductor layer 30 is overgrown, it may be additionally planarized by an etch-back process or a chemical mechanical polishing (CMP) process.

Next, referring to FIGS. 3b and 3c, in the source and drain electrode and p-type nitride semiconductor segment forming step, the source and drain electrode forming step (FIG. 3b) and the p-type nitride semiconductor segment forming step (FIG. 3c) may be sequentially or reversely performed. As an example, the source and drain electrode forming step (FIG. 3b) and the p-type nitride semiconductor segment forming step (FIG. 3c) will be sequentially described.

Referring to FIG. 3b, in the source and drain electrode forming step, a source electrode 50 and a drain electrode 60, which is spaced apart from the source electrode 50, are formed to be in ohmic contact with the nitride semiconductor layer 30. At this time, the source and drain electrode forming step may be performed after the following p-type nitride semiconductor segment forming step (FIG. 3c).

For example, the source electrode 50 and the drain electrode 60 may be formed using metal, metal silicide, or alloys thereof. Further, in an example, the source electrode 50 and the drain electrode 60 may be made of the same material.

Next, referring to FIG. 3c, in the p-type nitride semiconductor segment forming step, a plurality of p-type nitride semiconductor segments 80 are formed on the nitride semiconductor layer 30 between the source and drain electrodes 50 and 60. At this time, each of the p-type nitride semiconductor segments 80 is formed lengthways from a source-side first sidewall 81, which is spaced apart from the source electrode 50 by a predetermined distance, to a drain side.

At this time, in an example, the plurality of predetermined p-type nitride semiconductor segments 80 may be formed by forming a p-type nitride semiconductor layer on the nitride semiconductor layer 30, patterning a plurality of p-type nitride semiconductor segment shapes through a patterning process, and performing an etching process.

In accordance with this embodiment, since 2DEG below the p-type nitride semiconductor segments 80 is depleted and configured to cross with 2DEG in a portion without the p-type nitride semiconductor segments 80, the 2DEG channel 35 and the p-type nitride semiconductor segments 80 are depleted together in turn-off so that it is possible to implement a high withstand voltage due to high channel resistance. Further, it is possible to reduce a distance between the gate electrode 70 and the drain electrode 60 as much as the withstand voltage of the device in accordance with an embodiment of the present invention is improved, thereby reducing on-resistance. Further, in accordance with an example, in order to effectively deplete the 2DEG in turn-off, it is possible to adjust a doping density of the p-type nitride semiconductor segments 80, an interval between the segments 80, and a size of the segment 80.

In accordance with another example, in the p-type nitride semiconductor segment forming step (FIG. 3c), the p-type nitride semiconductor segments 80 using the material of the first nitride layer 31 may be formed. For example, the material of the first nitride layer 31 may include gallium nitride (GaN), and the p-type nitride semiconductor segments 80 may be made of a p-GaN material.

Further, in accordance with an example, in the p-type nitride semiconductor segment forming step (FIG. 3c), as shown in FIG. 3c, the p-type nitride semiconductor segments 80 may be formed so that drain-side second sidewalls 83 of the p-type nitride semiconductor segments 80 are spaced apart from the drain electrode 60 by a predetermined distance. Further, although not shown, the p-type nitride semiconductor segments 80 may be formed so that the drain-side second sidewalls 83 of the p-type nitride semiconductor segments 80 are in contact with the drain electrode 60. In accordance with an example, it may be preferred that the drain-side second sidewalls 83 of the p-type nitride semiconductor segments 80 are spaced apart from the drain electrode 60 by a predetermined distance.

And, referring to FIG. 3d, in the gate electrode forming step, a gate electrode 70 is formed between the source and drain electrodes 50 and 60 to be close to the source electrode 50. At this time, a portion of the gate electrode 70 is disposed to be in contact with the nitride semiconductor layer 30 between the plurality of p-type nitride semiconductor segments 80, and another portion of the gate electrode 70 is disposed to be in contact with a portion of each of the p-type nitride semiconductor segments 80. At this time, the gate electrode 70 may be in Schottky contact. Further, a source-side sidewall 71 of the gate electrode 70 is disposed to be aligned with the first sidewall 81 of each of the p-type nitride semiconductor segments 80. At this time, portions of the p-type nitride semiconductor segments 80, which are in contact with a lower portion of the gate electrode 70, extends in the direction of the source-side sidewall 71 of the gate electrode 70.

In accordance with another example, in the gate electrode forming step (FIG. 3d), as shown in FIGS. 1a or/and 3d, the gate electrode 70 may be formed so that the source-side sidewall 71 of the gate electrode 70 is aligned to coincide with the first sidewalls 81 of the p-type nitride semiconductor segments 80 or as shown in FIG. 1b, the gate electrode 70 may be formed so that the first sidewalls 81 of the p-type nitride semiconductor segments 80 do not reach the source-side sidewall 71 of the gate electrode 70.

For example, the gate electrode 70 may be formed using metal, metal silicide, or alloys thereof. Further, in an example, the Schottky-contacted gate electrode 70 may be made of a material from the ohmic-contacted source electrode 50 and drain electrode 60.

According to this embodiment, it is possible to promote partial removal of 2DEG and formation of 2DHG or a p-type semiconductor layer by forming portions of the p-type nitride semiconductor segments 80, which is connected to the gate electrode 70, between the gate electrode 70 and the drain electrode 60 on the nitride semiconductor layer 30 having the 2DEG channel 35.

Next, a method of manufacturing a nitride semiconductor device in accordance with a fifth embodiment of the present invention will be described with reference to FIGS. 5a to 5d. The fifth embodiment of the present invention relates to a method of manufacturing the nitride semiconductor device in accordance with the above-described second embodiment and refers to the above-described second embodiment and FIG. 4. Accordingly, repeated description will be omitted.

Referring to FIGS. 5a to 5d, a method of manufacturing a nitride semiconductor device in accordance with the fifth embodiment of the present invention includes a heterojunction nitride semiconductor layer forming step (FIG. 5a), a source and drain electrode and p-type nitride semiconductor segment forming step (FIGS. 5b and 5c), and a gate electrode forming step (FIG. 5d). At this time, the source and drain electrode and p-type nitride semiconductor segment forming step (FIGS. 5b and 5c) may sequentially perform the source and drain electrode forming step (FIG. 5b) and the p-type nitride semiconductor segment forming step (FIG. 5c) or perform the source and drain electrode forming step (FIG. 5b) after performing the p-type nitride semiconductor segment forming step (FIG. 5c) in reverse order.

First, referring to FIG. 5a, in the heterojunction nitride semiconductor layer forming step, a first nitride layer 31 is hetero-joined to a second nitride layer 33 which includes a material with a wider energy band gap than a material of the first nitride layer 31. According to heterojunction, a two-dimensional electron gas (2DEG) channel 35 is formed near a junction interface. The second nitride layer 33 plays a role of supplying electrons to the 2DEG channel 35 in the first nitride layer 31.

In an example, a nitride used in a nitride semiconductor layer 30 may be gallium nitride (GaN), aluminum gallium nitride (AlGaN), indium gallium nitride (InGaN), or indium aluminum gallium nitride (InAlGaN) but not limited thereto. Further, in an example, the first nitride layer 31 may include gallium nitride (GaN), and the second nitride layer 33 may include one of aluminum gallium nitride (AlGaN), indium gallium nitride (InGaN), and indium aluminum gallium nitride (InAlGaN). For example, the material of the first nitride layer 31 may include gallium nitride (GaN), and the material of the second nitride layer 33 may include aluminum gallium nitride (AlGaN).

In an example, the first nitride layer 31 and the second nitride layer 33 are formed by an epitaxial growth process. For example, as shown in FIG. 5a, the first nitride layer 31 may be formed by epitaxially growing a gallium nitride single crystal thin film on a substrate 10. At this time, the substrate 10 may be manufactured using at least one of silicon (Si), silicon carbide (SiC), and sapphire ($Al_2O_3$) or other well-known substrate materials. Further, although not shown, the first nitride layer 31 may be epitaxially grown on a buffer layer after epitaxially growing the buffer layer on the substrate 10. Next, the second nitride layer 33 is formed by epitaxially growing a nitride layer including a heterogeneous gallium nitride material with a wider energy band gap than the first nitride layer 31 by using the first nitride layer 31 as a seed layer.

The first and second nitride layers 31 and 33 may be formed by an epitaxial growth process such as liquid phase epitaxy (LPE), chemical vapor deposition (CVD), molecular beam epixaxy (MBE), or metal-organic CVD (MOCVD).

Next, referring to FIGS. 5b and 5c, in the source and drain electrode and p-type nitride semiconductor segment forming step, the source and drain electrode forming step (FIG. 5b) and the p-type nitride semiconductor segment forming step (FIG. 5c) may be sequentially or reversely performed. As an example, the source and drain electrode forming step (FIG. 5b) and the p-type nitride semiconductor segment forming step (FIG. 5c) will be sequentially described.

Referring to FIG. 5b, in the source and drain electrode forming step, a source electrode 50 and a drain electrode 60, which is spaced apart from the source electrode 50, are formed to be in ohmic contact with the nitride semiconductor layer 30. At this time, the source and drain electrode forming step may be performed after the following p-type nitride semiconductor segment forming step.

For example, the source electrode 50 and the drain electrode 60 may be formed using metal, metal silicide, or alloys thereof. Further, in an example, the source electrode 50 and the drain electrode 60 may be made of the same material.

Next, referring to FIG. 5c, in the p-type nitride semiconductor segment forming step, a plurality of p-type nitride semiconductor segments 80 are formed on the nitride semiconductor layer 30 between the source and drain electrodes 50 and 60 and formed lengthways from a source-side first sidewall 81, which is spaced apart from the source electrode 50 by a predetermined distance, to a drain side.

At this time, in an example, the plurality of predetermined p-type nitride semiconductor segments 80 may be formed by forming a p-type nitride semiconductor layer on the nitride semiconductor layer 30, patterning a plurality of p-type nitride semiconductor segment shapes through a patterning process, and performing an etching process.

In accordance with this embodiment, since 2DEG below the p-type nitride semiconductor segments 80 is depleted and configured to cross with 2DEG in a portion without the p-type nitride semiconductor segments 80, the 2DEG channel 35 and the p-type nitride semiconductor segments 80 are depleted together in turn-off so that it is possible to implement a high withstand voltage due to high channel resistance. Further, it is possible to reduce a distance between the gate electrode 70 and the drain electrode 60 as much as the withstand voltage of the device in accordance with an embodiment of the present invention is improved, thereby reducing on-resistance. Further, in accordance with an example, in order to effectively deplete the 2DEG in turn-off, it is possible to adjust a doping density of the p-type nitride semiconductor segments 80, an interval between the segments 80, and a size of the segment 80.

In accordance with another example, in the p-type nitride semiconductor segment forming step (FIG. 5c), the p-type nitride semiconductor segments 80 using the material of the first nitride layer 31 may be formed. For example, the material of the first nitride layer 31 may include gallium nitride (GaN), and the p-type nitride semiconductor segments 80 may be made of a p-GaN material.

Further, in accordance with an example, in the p-type nitride semiconductor segment forming step (FIG. 5c), as shown in FIGS. 5c and/or 4, the p-type nitride semiconductor segments 80 may be formed so that drain-side second sidewalls 83 of the p-type nitride semiconductor segments 80 are spaced apart from the drain electrode 60 by a predetermined distance. Further, although not shown, the p-type nitride semiconductor segments 80 may be formed so that the drain-side second sidewalls 83 of the p-type nitride semiconductor segments 80 are in contact with the drain electrode 60. In accordance with an example, it may be preferred that the drain-side second sidewalls 83 of the p-type nitride semiconductor segments 80 are spaced apart from the drain electrode 60 by a predetermined distance.

And, referring to FIG. 5d, in the gate electrode forming step, a gate electrode 70 is formed on the nitride semiconductor layer 30 between the source and drain electrodes 50 and 60 to be close to the source electrode 50. At this time, the gate electrode 70 may be in Schottky contact. At this time, a drain-side sidewall of the gate electrode 70 is in contact with the first sidewall 81 of each of the p-type nitride semiconductor segments 80.

For example, the gate electrode 70 may be formed using metal, metal silicide, or alloys thereof. Further, in an example, the Schottky-contacted gate electrode 70 may be made of a material different from the ohmic-contacted source electrode 50 and drain electrode 60.

Next, a method of manufacturing a nitride semiconductor device in accordance with a sixth embodiment of the present invention will be described with reference to FIGS. 8a to 8d. The sixth embodiment of the present invention relates to a method of manufacturing the nitride semiconductor device in accordance with the above-described third embodiment and refers to the above-described third embodiment and FIG. 6. Accordingly, repeated description will be omitted.

Referring to FIGS. 8a to 8d, a method of manufacturing a nitride semiconductor device in accordance with a sixth embodiment of the present invention includes a heterojunction nitride semiconductor layer forming step (FIG. 8a), a source and drain electrode and p-type nitride semiconductor segment forming step (FIGS. 8b and 8c), and a gate electrode forming step (FIG. 8d). At this time, the source and drain electrode and p-type nitride semiconductor segment forming step (FIGS. 8b and 8c) may sequentially perform the source and drain electrode forming step (FIG. 8b) and the p-type nitride semiconductor segment forming step (FIG. 8c) or perform the source and drain electrode forming step (FIG. 8b) after performing the p-type nitride semiconductor segment forming step (FIG. 8c) in reverse order.

First, referring to FIG. 8a, in the heterojunction nitride semiconductor layer forming step, a first nitride layer 31 is hetero-joined to a second nitride layer 33 which includes a material with a wider energy band gap than a material of the first nitride layer 31. According to the heterojunction, a two-dimensional electron gas (2DEG) channel is formed near a junction interface.

In an example, a nitride used in a nitride semiconductor layer 30 may be gallium nitride (GaN), aluminum gallium nitride (AlGaN), indium gallium nitride (InGaN), or indium aluminum gallium nitride (InAlGaN) but not limited thereto. Further, in an example, the first nitride layer 31 may include gallium nitride (GaN), and the second nitride layer 33 may include one of aluminum gallium nitride (AlGaN), indium gallium nitride (InGaN), and indium aluminum gallium nitride (InAlGaN). For example, the material of the first nitride layer 31 may include gallium nitride (GaN), and the material of the second nitride layer 33 may include aluminum gallium nitride (AlGaN).

In an example, the first nitride layer 31 and the second nitride layer 33 are formed by an epitaxial growth process. For example, as shown in FIG. 5a, the first nitride layer 31 may be formed by epitaxially growing a gallium nitride single crystal thin film on a substrate 10. Further, although not shown, the first nitride layer 31 may be epitaxially grown on a buffer layer after epitaxially growing the buffer layer on the substrate 10. Next, the second nitride layer 33 is formed by epitaxially growing a nitride layer including a heterogeneous gallium nitride material with a wider energy band gap than the first nitride layer 31 by using the first nitride layer 31 as a seed layer. The first and second nitride layers 31 and 33 may be formed by an epitaxial growth process such as liquid phase epitaxy (LPE), chemical vapor deposition (CVD), molecular beam epixaxy (MBE), or metal-organic CVD (MOCVD).

Next, referring to FIGS. 8b and 8c, in the source and drain electrode and p-type nitride semiconductor segment forming step, the source and drain electrode forming step (FIG. 8b) and the p-type nitride semiconductor segment forming step (FIG. 8c) may be sequentially or reversely performed. As an example, the source and drain electrode forming step (FIG. 8b) and the p-type nitride semiconductor segment forming step (FIG. 8c) will be sequentially described.

Referring to FIG. 8b, in the source and drain electrode forming step, a source electrode 50 and a drain electrode 60, which is spaced apart from the source electrode 50, are formed to be in ohmic contact with the nitride semiconductor layer 30. At this time, the source and drain electrode forming step may be performed after the following p-type nitride semiconductor segment forming step.

For example, the source electrode 50 and the drain electrode 60 may be formed using metal, metal silicide, or alloys thereof. Further, in an example, the source electrode 50 and the drain electrode 60 may be made of the same material.

Next, referring to FIG. 8c, in the p-type nitride semiconductor segment forming step, a p-type nitride semiconductor structure 180 is formed on the nitride semiconductor layer 30 between the source and drain electrodes 50 and 60. At this time, the p-type nitride semiconductor structure 180 includes a trunk portion 181, which is spaced apart from the source electrode 50 in parallel by a predetermined distance, and a plurality of branch segments 183, which are formed lengthways from the trunk portion 181 to a drain side.

At this time, in an example, the predetermined p-type nitride semiconductor structure 180 may be formed by forming a p-type nitride semiconductor layer on the nitride semiconductor layer 30, patterning a p-type nitride semiconductor structure shape through a patterning process, and performing an etching process.

In accordance with this embodiment, since 2DEG below the branch segments 183 of the p-type nitride semiconductor structure 180 is depleted and configured to cross with 2DEG in a portion without the branch segments 183 of the p-type nitride semiconductor structure 180, the 2DEG channel 35 and the branch segments 183 of the p-type nitride semiconductor structure 80 are depleted together in turn-off so that it is possible to implement a high withstand voltage due to high channel resistance. Further, it is possible to reduce a distance between the gate electrode 70 and the drain electrode 60 as much as the withstand voltage of the device in accordance with an embodiment of the present invention is improved, thereby reducing on-resistance. Further, in accordance with an example, in order to effectively deplete the 2DEG in turn-off, it is possible to adjust a doping density of the p-type nitride semiconductor structure 180, an interval between the segments, and a size of the segment.

In accordance with another example, in the p-type nitride semiconductor structure forming step (FIG. 8c), the p-type nitride semiconductor structure 180 may be formed using the material of the first nitride layer 31. For example, the material of the first nitride layer 31 may include gallium nitride (GaN), and the p-type nitride semiconductor structure 180 may be made of a p-GaN material.

Further, in accordance with an example, in the p-type nitride semiconductor structure forming step (FIG. 8c), as shown in FIGS. 8c and/or 6, drain-side second sidewalls 183a of the branch segments 183 of the p-type nitride semiconductor structure 180 may be formed to be spaced apart from the drain electrode 60 by a predetermined distance or although not shown, the drain-side second sidewalls 183a of the branch segments 183 of the p-type nitride semiconductor structure 180 may be in contact with the drain electrode 60. In accordance with an example, it may be preferred that the drain-side second sidewalls 183*a* of the branch segments 183 of the p-type nitride semiconductor structure 180 is spaced apart from the drain electrode 60 by a predetermined distance.

And, referring to FIG. 8*d*, in the gate electrode forming step, a gate electrode 70 is formed between the source and drain electrodes 50 and 60 to be close to the source electrode 50. At this time, a portion of the gate electrode 70 is disposed to be in contact with the nitride semiconductor layer 30, and another portion of the gate electrode 70 is disposed to be in contact with the trunk portion 181 of the p-type nitride semiconductor structure 180. At this time, the gate electrode 70 may be in Schottky contact. Further, a source-side sidewall 71 of the gate electrode 70 is formed to be aligned with the first sidewall 181*a* of the trunk portion 181 of the p-type nitride semiconductor structure 180. Moreover, the gate electrode 70 is formed so that the trunk portion 181 of the p-type nitride semiconductor structure 180, which is in contact with a lower portion of the gate electrode 70, does not reach the source-side sidewall 71 of the gate electrode 70.

For example, the gate electrode 70 may be formed using metal, metal silicide, or alloys thereof. Further, in an example, the Schottky-contacted gate electrode 70 may be made of a material different from the ohmic-contacted source electrode 50 and drain electrode 60.

In an example, the nitride semiconductor device in accordance with embodiments of the present invention may be a power transistor.

According to the nitride semiconductor device or the method of manufacturing a nitride semiconductor device in accordance with embodiments of the present invention, it is possible to promote partial removal of 2DEG and formation of 2DHG or a p-type semiconductor layer by forming portions of the p-type nitride semiconductor segments 80, which are connected to the gate electrode 70, between the gate electrode 70 and the drain electrode 60 on the nitride semiconductor layer 30 having the 2DEG channel 35.

In accordance with one aspect of the present invention, it is possible to deplete 2DEG of a channel in turn-off by partially forming a p-type nitride semiconductor layer on a nitride semiconductor layer structure, thereby improving a withstand voltage.

A nitride high electron mobility transistor (HFET) in accordance with an example of the present invention can implement a high withstand voltage compared to a conventional nitride semiconductor form.

Further, it is possible to implement low on-resistance by reducing a distance between gate and drain.

Although not explicitly described as preferable one aspect of the present invention, embodiments of the present invention in accordance with possible various combinations of the above-described technical features can be apparently implemented by those skilled in the art.

The above-described embodiments and the accompanying drawings are provided as examples to help understanding of those skilled in the art, not limiting the scope of the present invention. Therefore, the various embodiments of the present invention may be embodied in different forms in a range without departing from the essential concept of the present invention, and the scope of the present invention should be interpreted from the invention defined in the claims. It is to be understood that the present invention includes various modifications, substitutions, and equivalents by those skilled in the art.

What is claimed is:

1. A nitride semiconductor device comprising:
a nitride semiconductor layer formed by a heterojunction of a first nitride layer and a second nitride layer, which includes a material with a wider energy band gap than a material of the first nitride layer, and having a two-dimensional electron gas (2DEG) channel formed near a junction interface;
a source electrode in ohmic contact with the nitride semiconductor layer;
a drain electrode in ohmic contact with the nitride semiconductor layer while being spaced apart from the source electrode;
a plurality of p-type nitride semiconductor segments formed on the nitride semiconductor layer between the source and drain electrodes and each formed lengthways from a first sidewall thereof, which is spaced apart from the source electrode by a predetermined distance, to a drain side; and
a gate electrode formed between the source and drain electrodes to be close to the source electrode and directly in contact with the nitride semiconductor layer between the plurality of p-type semiconductor segments and portions of the p-type semiconductor segments extending in the direction of a source-side sidewall of the gate electrode aligned with the first sidewalls of the p-type nitride semiconductor segments.

2. The nitride semiconductor device according to claim 1, wherein the first sidewalls of the p-type nitride semiconductor segments are aligned to coincide with the source-side sidewall of the gate electrode or not to reach the source-side sidewall.

3. The nitride semiconductor device according to claim 1, wherein drain-side second sidewalls of the p-type nitride semiconductor segments are spaced apart from the drain electrode by a predetermined distance or in contact with the drain electrode.

4. The nitride semiconductor device according to claim 1, wherein the material of the first nitride layer is GaN, and the material of the second nitride layer is AlGaN.

5. The nitride semiconductor device according to claim 1, wherein the p-type nitride semiconductor segments are made of a p-type semiconductor material obtained by doping the material of the first nitride layer as p-type.

6. A nitride semiconductor device comprising:
a nitride semiconductor layer formed by a heterojunction of a first nitride layer and a second nitride layer, which includes a material with a wider energy band gap than a material of the first nitride layer, and having a two-dimensional electron gas (2DEG) channel formed near a junction interface;
a source electrode in ohmic contact with the nitride semiconductor layer;
a drain electrode in ohmic contact with the nitride semiconductor layer while being spaced apart from the source electrode;
a plurality of p-type nitride semiconductor segments formed on the nitride semiconductor layer between the source and drain electrodes and each formed lengthways from a first sidewall thereof, which is spaced apart from the source electrode by a predetermined distance, to a drain side; and
a gate electrode formed on the nitride semiconductor layer between the source and drain electrodes to be close to the source electrode and having a drain-side sidewall directly in contact with the first sidewalls of the p-type nitride semiconductor segments.

7. The nitride semiconductor device according to claim 6, wherein drain-side second sidewalls of the p-type nitride semiconductor segments are spaced apart from the drain electrode by a predetermined distance or in contact with the drain electrode.

8. The nitride semiconductor device according to claim 6, wherein the material of the first nitride layer is GaN, and the material of the second nitride layer is AlGaN.

9. The nitride semiconductor device according to claim 6, wherein the p-type nitride semiconductor segments are made of a p-type semiconductor material obtained by doping the material of the first nitride layer as p-type.

10. A nitride semiconductor device comprising:
a nitride semiconductor layer formed by a heterojunction of a first nitride layer and a second nitride layer, which includes a material with a wider energy band gap than a material of the first nitride layer, and having a two-dimensional electron gas (2DEG) channel formed near a junction interface;
a source electrode in ohmic contact with the nitride semiconductor layer;
a drain electrode in ohmic contact with the nitride semiconductor layer while being spaced apart from the source electrode;
a p-type nitride semiconductor structure formed on the nitride semiconductor layer between the source and drain electrodes and including a trunk portion spaced apart from the source electrode in parallel by a predetermined distance and a plurality of branch segments formed lengthways from the trunk portion to a drain side; and
a gate electrode formed between the source and drain electrodes to be close to the source electrode and directly in contact with the nitride semiconductor layer and the trunk portion of the p-type nitride semiconductor structure, which does not reach a source-side sidewall of the gate electrode aligned with a source-side first sidewall of the trunk portion.

11. The nitride semiconductor device according to claim 10, wherein drain-side second sidewalls of the branch segments of the p-type nitride semiconductor structure are spaced apart from the drain electrode by a predetermined distance or in contact with the drain electrode.

12. The nitride semiconductor device according to claim 10, wherein the material of the first nitride layer is GaN, and the material of the second nitride layer is AlGaN.

13. The nitride semiconductor device according to claim 10, wherein the p-type nitride semiconductor structure is made of a p-type semiconductor material obtained by doping the material of the first nitride layer as p-type.

14. A method of manufacturing a nitride semiconductor device comprising:
forming a heterojunction nitride semiconductor layer having a two-dimensional electron gas (2DEG) channel near a junction interface by a heterojunction of a first nitride layer and a second nitride layer which includes a material with a wider energy band gap than a material of the first nitride layer;
forming source and drain electrodes and a plurality of p-type nitride semiconductor segments by forming the source electrode and the drain electrode, which is spaced apart from the source electrode, to be in ohmic contact with the nitride semiconductor layer and forming the plurality of p-type nitride semiconductor segments on the nitride semiconductor layer, wherein each of the p-type nitride semiconductor segments is disposed between the source and drain electrodes and each formed lengthways from a first sidewall thereof, which is spaced apart from the source electrode by a predetermined distance, to a drain side; and
forming a gate electrode which is disposed between the source and drain electrodes to be close to the source electrode and directly in contact with the nitride semiconductor layer between the plurality of p-type nitride semiconductor segments and portions of the p-type nitride semiconductor segments extending in the direction of a source-side sidewall of the gate electrode aligned with the first sidewalls of the p-type nitride semiconductor segments.

15. The method of manufacturing a nitride semiconductor device according to claim 14, wherein in forming the gate electrode, the gate electrode is formed so that the source-side sidewall of the gate electrode is aligned to coincide with the first sidewalls of the p-type nitride semiconductor segments or the first sidewalls of the p-type nitride semiconductor segments are aligned not to reach the source-side sidewall of the gate electrode.

16. The method of manufacturing a nitride semiconductor device according to claim 14, wherein the p-type nitride semiconductor segments are formed so that drain-side second sidewalls of the p-type nitride semiconductor segments are spaced apart from the drain electrode by a predetermined distance or in contact with the drain electrode.

17. The method of manufacturing a nitride semiconductor device according to claim 14, wherein the material of the first nitride layer is GaN, the material of the second nitride layer is AlGaN, and the p-type nitride semiconductor segments are formed using p-GaN.

18. A method of manufacturing a nitride semiconductor device comprising:
forming a heterojunction nitride semiconductor layer having a two-dimensional electron gas (2DEG) channel near a junction interface by a heterojunction of a first nitride layer and a second nitride layer which includes a material with a wider energy band gap than a material of the first nitride layer;
forming source and drain electrodes and a plurality of p-type nitride semiconductor segments by forming the source electrode and the drain electrode, which is spaced apart from the source electrode, to be in ohmic contact with the nitride semiconductor layer and forming the plurality of p-type nitride semiconductor segments on the nitride semiconductor layer, wherein each of the p-type nitride semiconductor segments is disposed between the source and drain electrodes and each formed lengthways from a first sidewall thereof, which is spaced apart from the source electrode by a predetermined distance, to a drain side; and
forming a gate electrode which is disposed on the nitride semiconductor layer between the source and drain electrodes to be close to the source electrode and of which a drain-side sidewall is directly in contact with the first sidewalls of the p-type nitride semiconductor segments.

19. The method of manufacturing a nitride semiconductor device according to claim 18, wherein the p-type nitride semiconductor segments are formed so that drain-side second sidewalls of the p-type nitride semiconductor segments are spaced apart from the drain electrode by a predetermined distance or in contact with the drain electrode.

20. The method of manufacturing a nitride semiconductor device according to claim 18, wherein the material of the first nitride layer is GaN, the material of the second nitride layer is AlGaN, and the p-type nitride semiconductor segments are formed using p-GaN.

21. A method of manufacturing a nitride semiconductor device comprising:
forming a heterojunction nitride semiconductor layer having a two-dimensional electron gas (2DEG) channel near a junction interface by a heterojunction of a first nitride layer and a second nitride layer which includes a material with a wider energy band gap than a material of the first nitride layer;
forming source and drain electrodes and a p-type nitride semiconductor structure by forming the source electrode and the drain electrode, which is spaced apart from the source electrode, to be in ohmic contact with the nitride semiconductor layer and forming the p-type nitride semiconductor structure, which includes a trunk portion and a plurality of branch segments formed from the trunk portion, on the nitride semiconductor layer, wherein the p-type nitride semiconductor structure is disposed between the source and drain electrodes, the trunk portion is spaced apart from the source electrode in parallel by a predetermined distance, and each of the branch segments is formed lengthways to a drain side; and
forming a gate electrode which is disposed between the source and drain electrodes to be close to the source electrode and directly in contact with the nitride semiconductor layer and the trunk portion of the p-type nitride semiconductor structure which does not reach a source-side sidewall of the gate electrode aligned with a source-side first sidewall of the trunk portion.

22. The method of manufacturing a nitride semiconductor device according to claim 21, wherein drain-side second sidewalls of the branch segments of the p-type nitride semiconductor structure are spaced apart from the drain electrode by a predetermined distance or in contact with the drain electrode.

23. The method of manufacturing a nitride semiconductor device according to claim 21 or 22, wherein the material of the first nitride layer is GaN, the material of the second nitride layer is AlGaN, and the p-type nitride semiconductor structure is formed using p-GaN.

* * * * *